(12) United States Patent
Fujimoto

(10) Patent No.: US 9,177,947 B2
(45) Date of Patent: Nov. 3, 2015

(54) SEMICONDUCTOR DEVICE HAVING EFFICIENT CAPACITOR ARRANGEMENT

(75) Inventor: Hiroyuki Fujimoto, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1128 days.

(21) Appl. No.: 12/628,474

(22) Filed: Dec. 1, 2009

(65) Prior Publication Data
US 2010/0133497 A1    Jun. 3, 2010

(30) Foreign Application Priority Data

Dec. 1, 2008  (JP) ................................. 2008-306543

(51) Int. Cl.
| | |
|---|---|
| H01L 47/00 | (2006.01) |
| H01L 27/02 | (2006.01) |
| H01L 27/108 | (2006.01) |
| H01L 49/02 | (2006.01) |
| H01L 27/24 | (2006.01) |
| H01L 45/00 | (2006.01) |

(52) U.S. Cl.
CPC ...... *H01L 27/0207* (2013.01); *H01L 27/10841* (2013.01); *H01L 27/10852* (2013.01); *H01L 27/2454* (2013.01); *H01L 27/2463* (2013.01); *H01L 28/91* (2013.01); *H01L 45/04* (2013.01); *H01L 45/06* (2013.01); *H01L 45/144* (2013.01); *H01L 45/147* (2013.01)

(58) Field of Classification Search
CPC .................................................. H01L 27/0207
USPC ....................... 257/2, 908, E27.084; 438/587
See application file for complete search history.

(56) References Cited

U.S. PATENT DOCUMENTS

| | | | | |
|---|---|---|---|---|
| 5,691,551 A | * | 11/1997 | Eimori ......................... | 257/303 |
| 6,440,801 B1 | * | 8/2002 | Furukawa et al. ............ | 438/272 |
| 6,882,556 B2 | * | 4/2005 | Fuhrmann et al. ............. | 365/63 |
| 2002/0005535 A1 | * | 1/2002 | Weis ............................. | 257/296 |
| 2005/0218440 A1 | * | 10/2005 | Park .............................. | 257/298 |
| 2008/0237776 A1 | * | 10/2008 | Abbott ......................... | 257/499 |
| 2008/0253160 A1 | * | 10/2008 | Popp et al. ...................... | 365/72 |

FOREIGN PATENT DOCUMENTS

| | | |
|---|---|---|
| JP | 06-021467 | 1/1994 |
| JP | 2002-026279 | 1/2002 |
| JP | 2003-209187 | 7/2003 |

* cited by examiner

*Primary Examiner* — Matthew Gordon

(57) ABSTRACT

The invention includes: multiple bit lines b1 to b5 arranged in parallel to each other at a first line pitch; multiple word lines w1 to w4 arranged in parallel to each other at a second line pitch greater than the first line pitch and intersecting with bit lines b1 to b5; and multiple capacitors. Respective center positions 4 of the multiple capacitors lie above the bit lines and are displaced by given distance C from the intersection of the bit line and the word line in a direction of arranging the word lines.

20 Claims, 23 Drawing Sheets

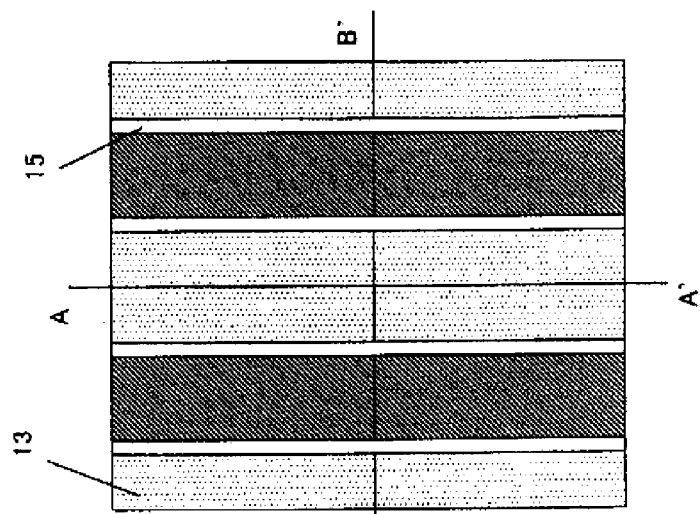
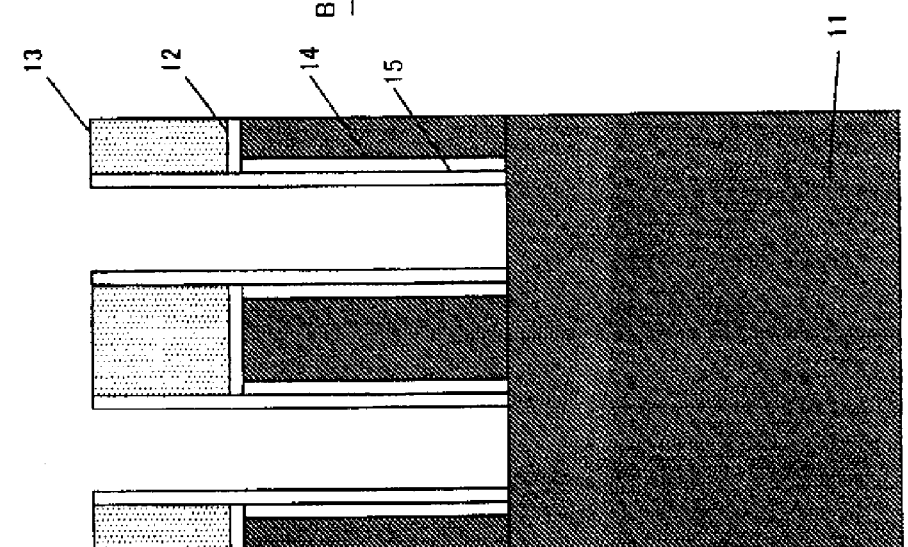
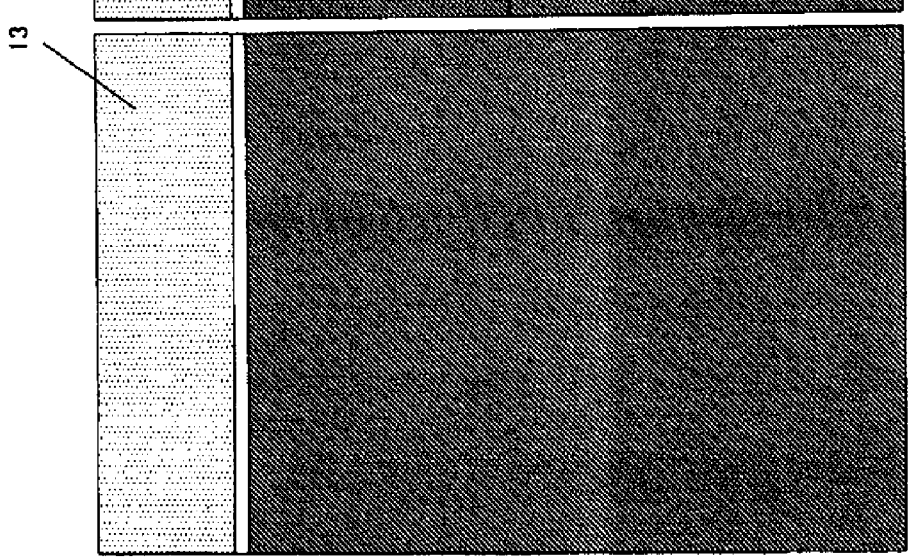

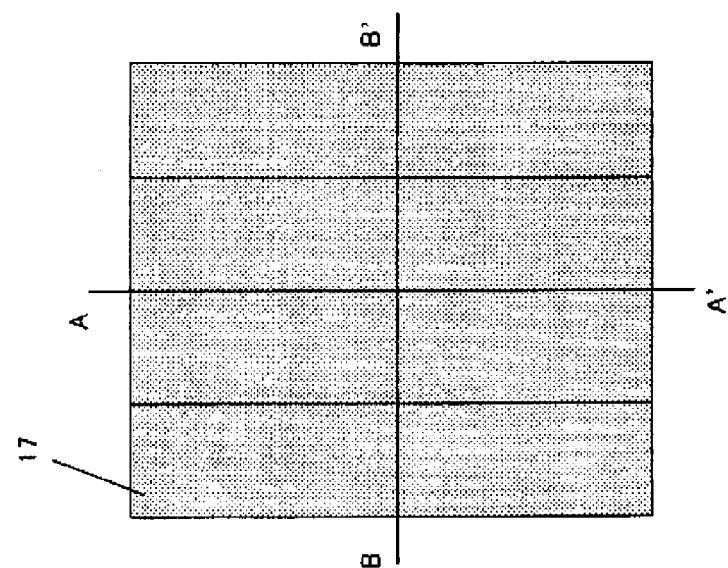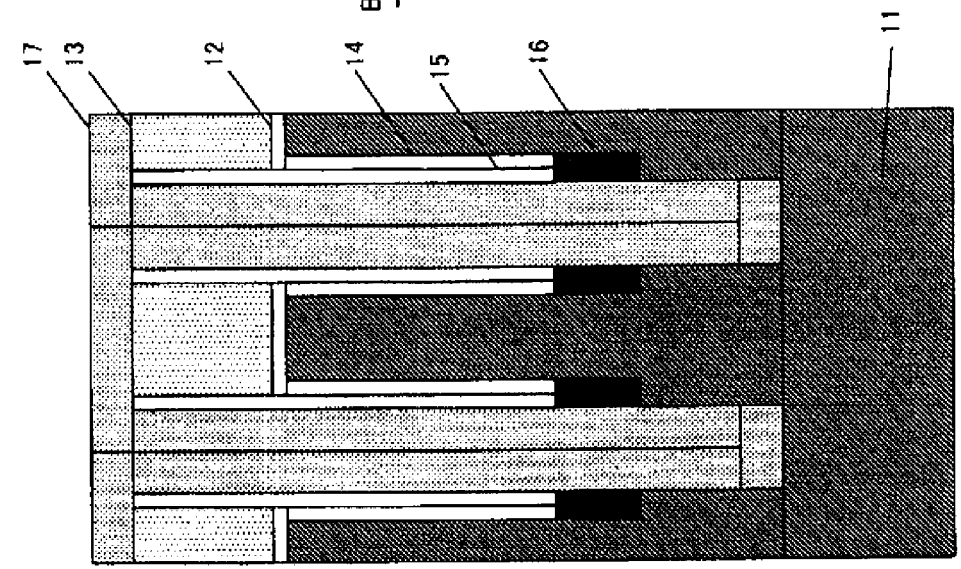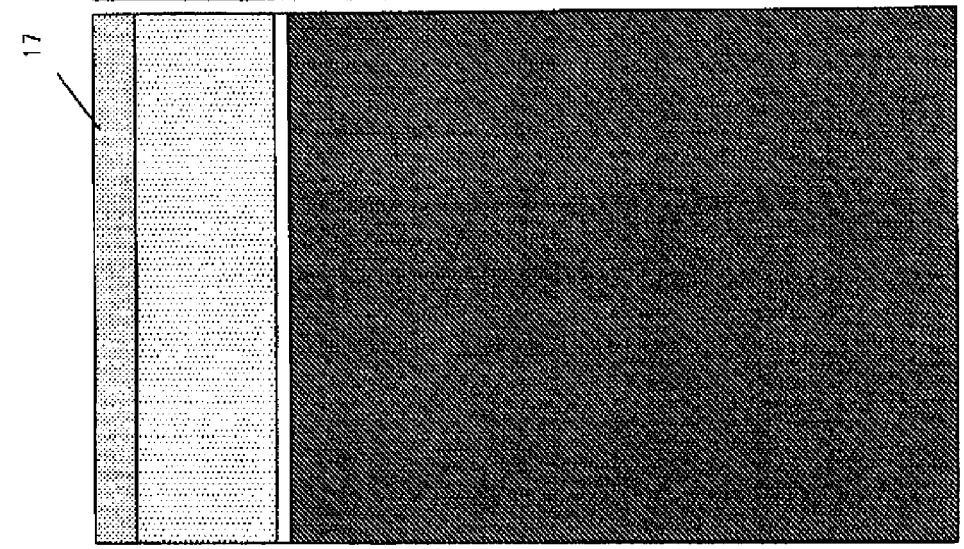

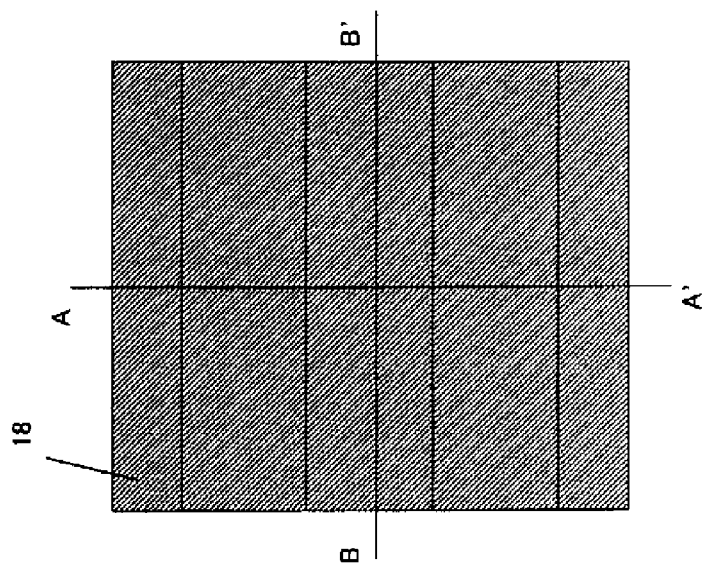
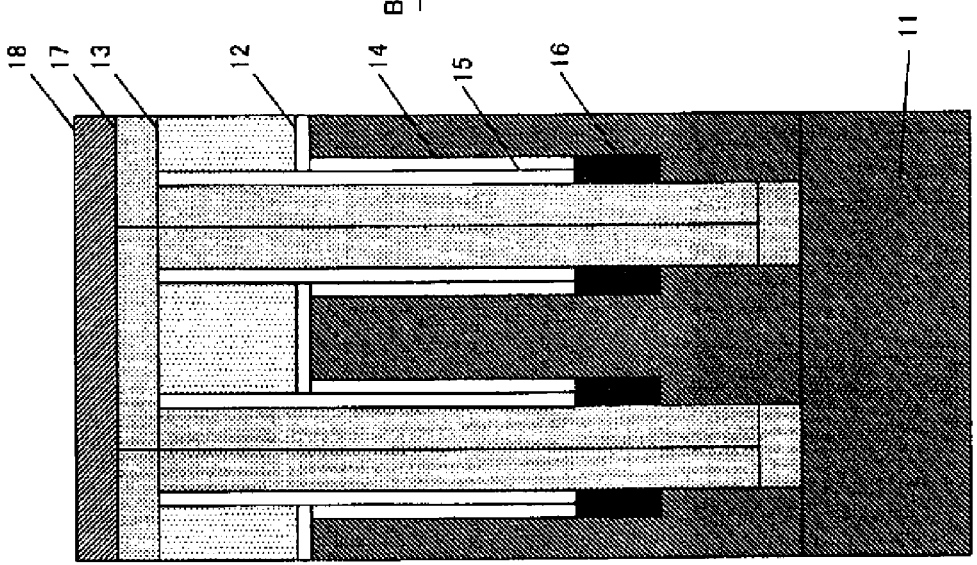
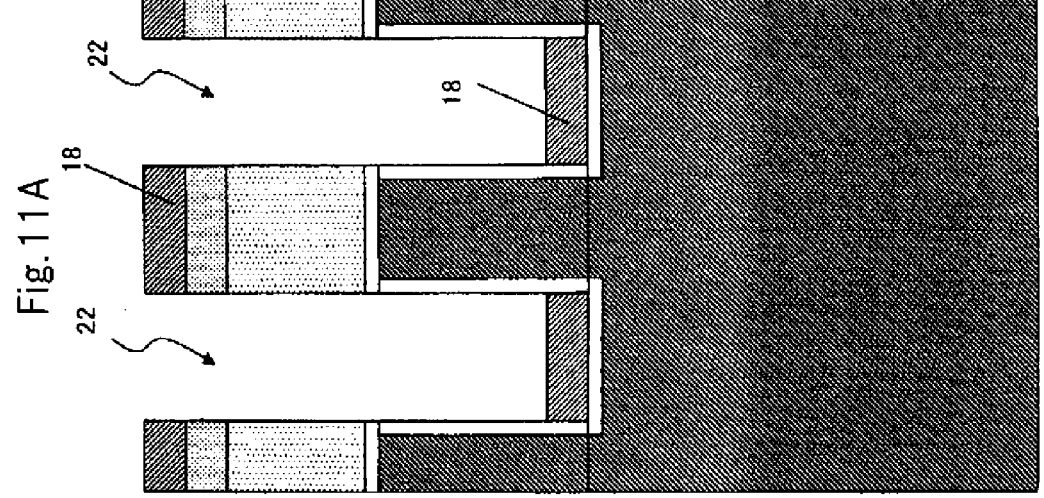
Fig.11C
Fig.11B
Fig.11A

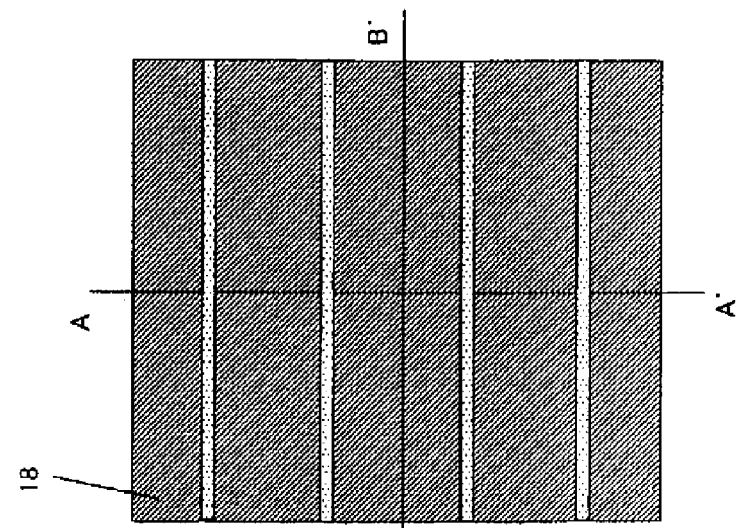
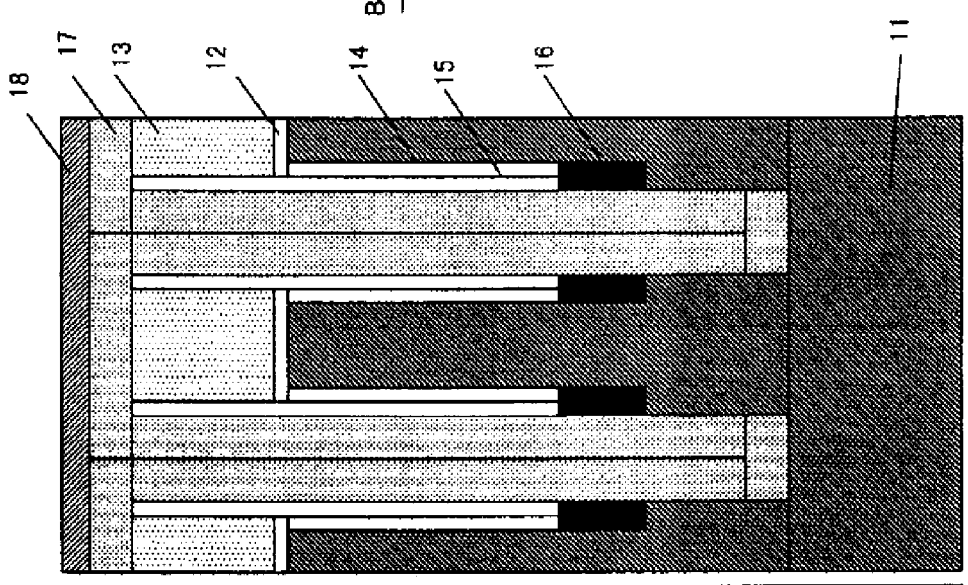
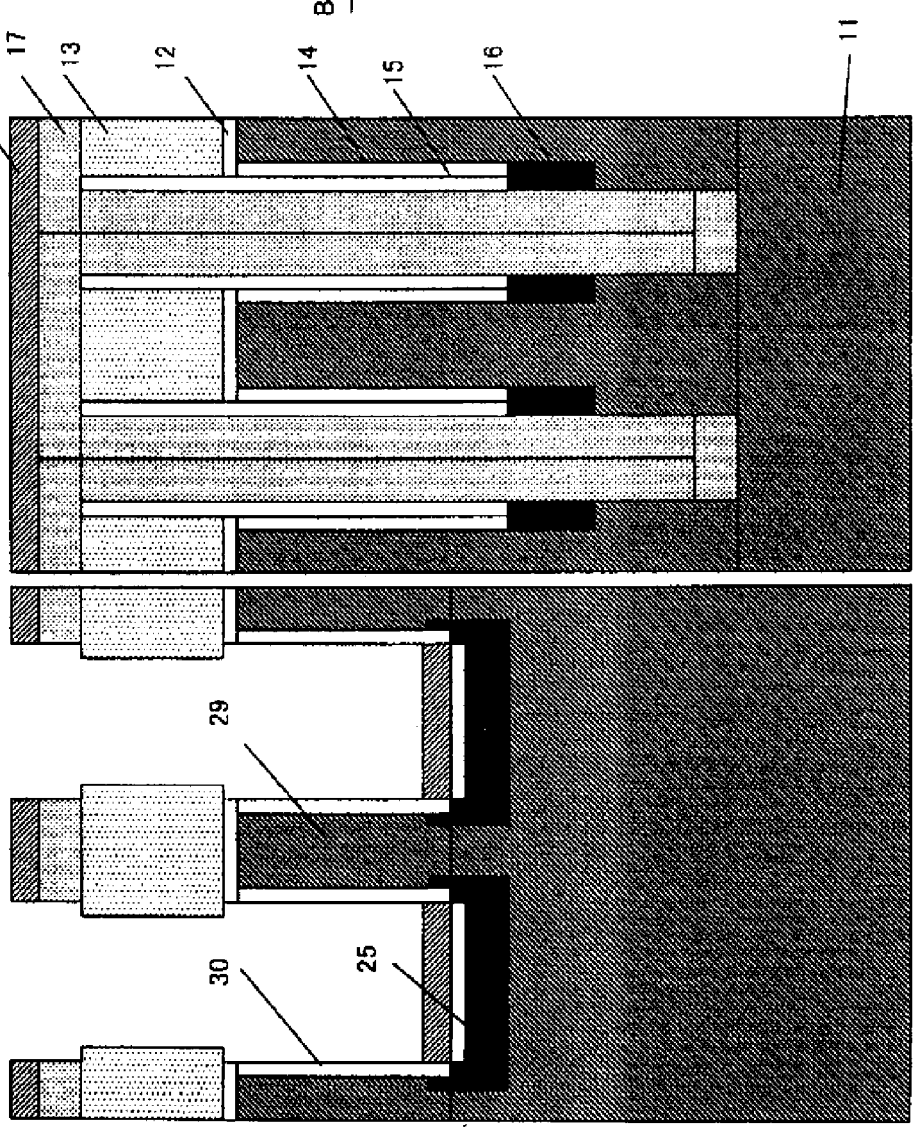

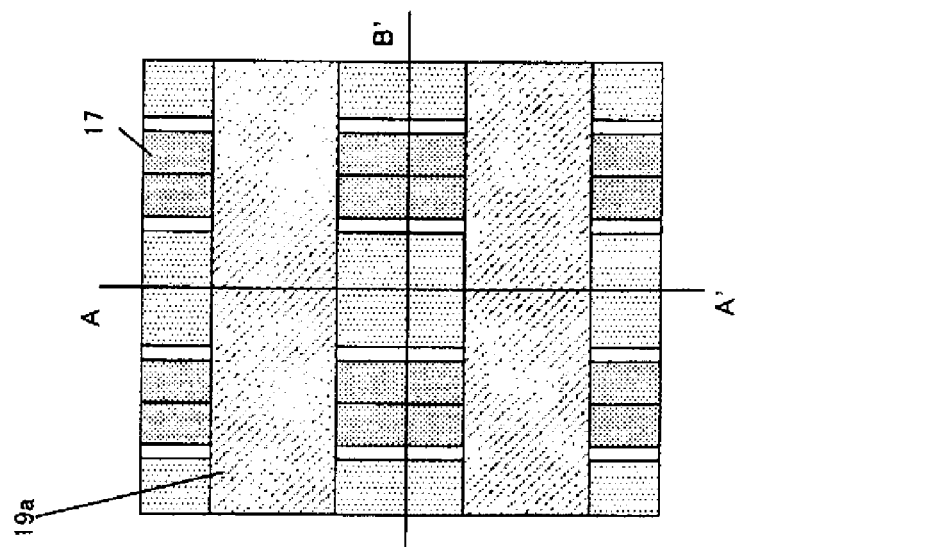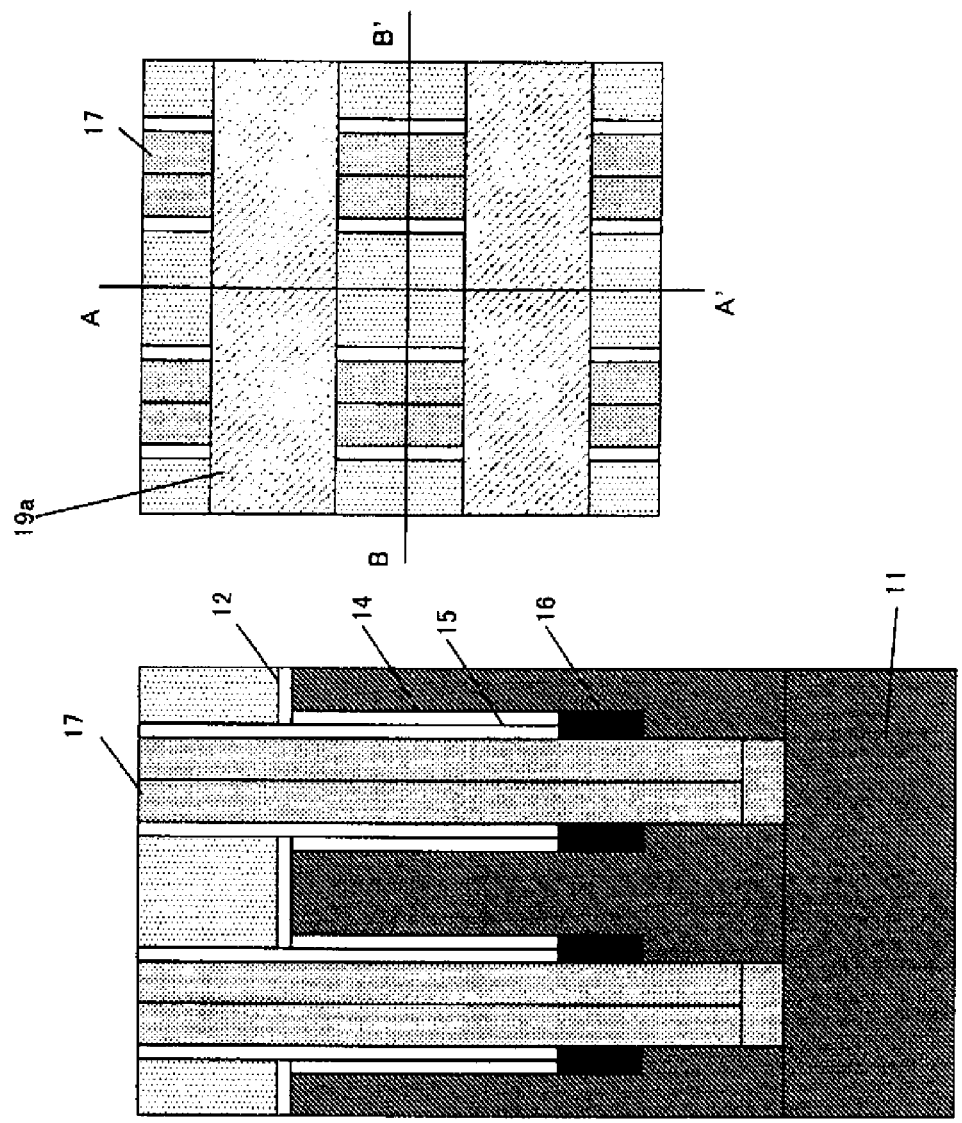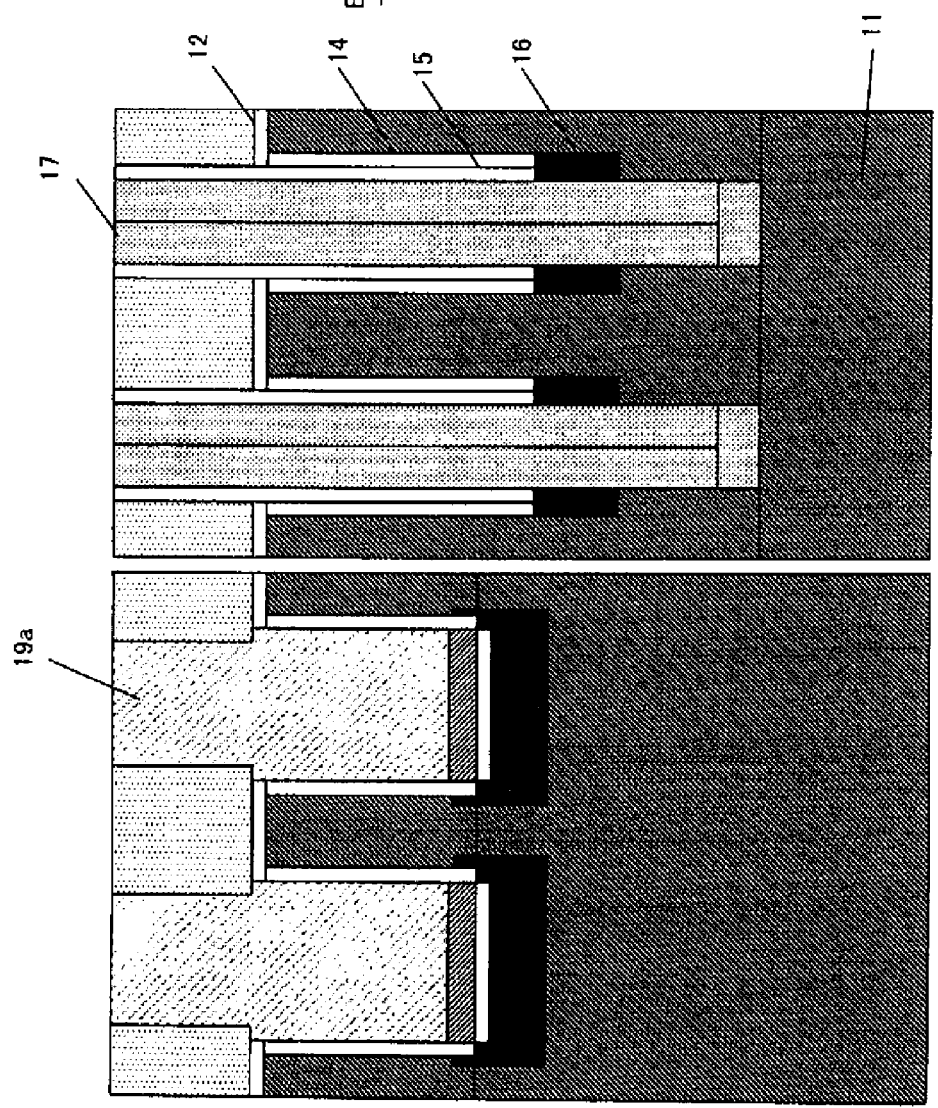

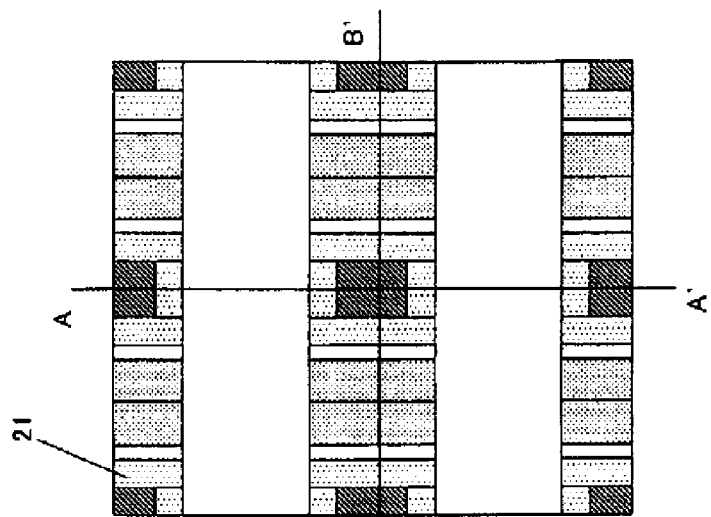
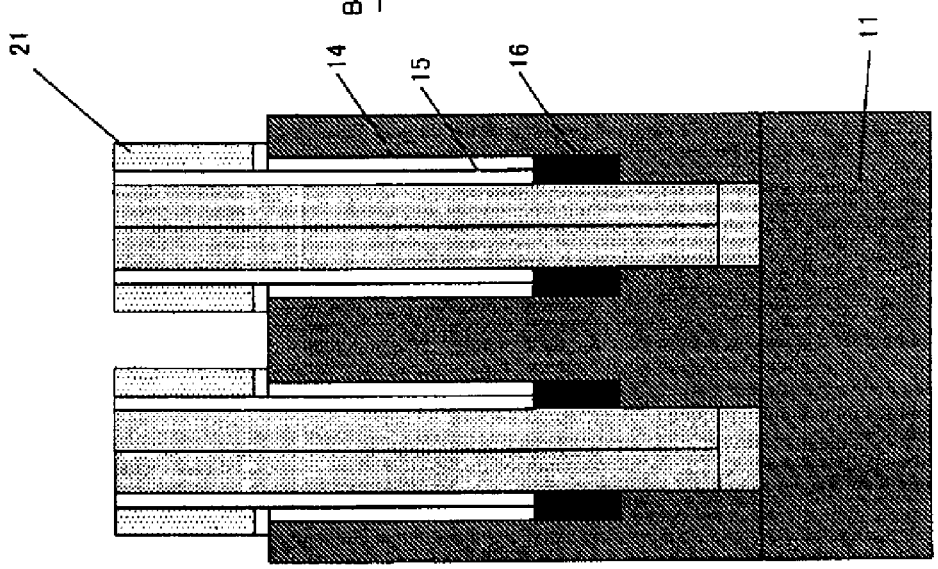
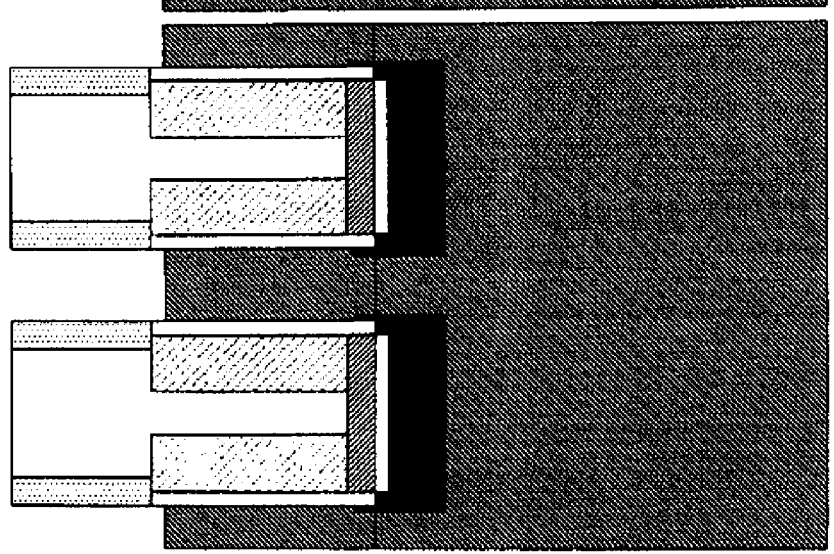
Fig.16A
Fig.16B
Fig.16C

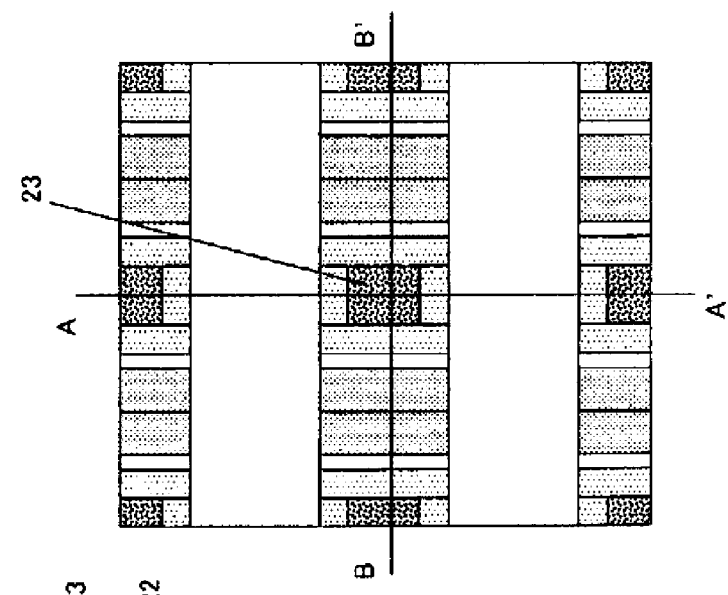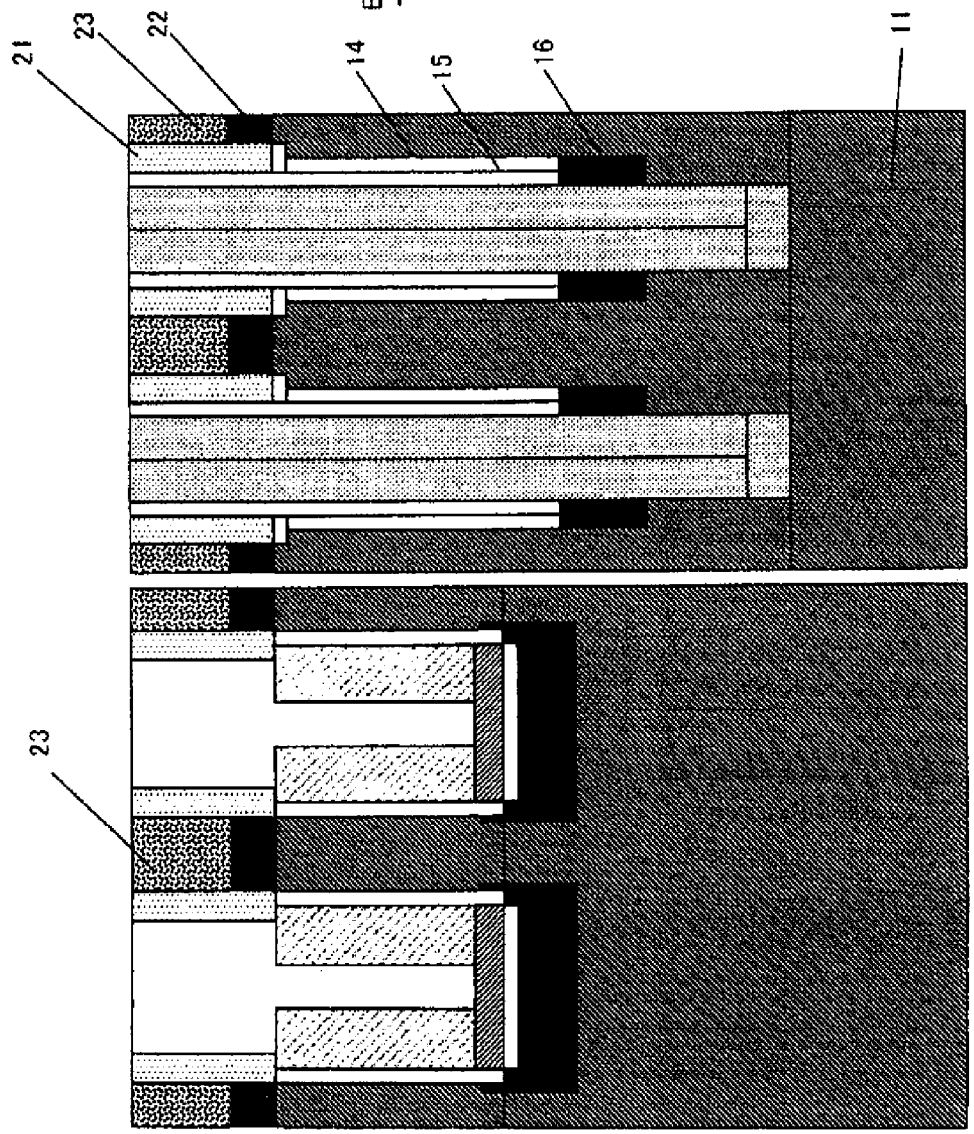

SEMICONDUCTOR DEVICE HAVING EFFICIENT CAPACITOR ARRANGEMENT

This application is based upon and claims the benefit of priority from Japanese patent application No. 2008-306543, filed on Dec. 1, 2008, the disclosure of which is incorporated herein in its entirety by reference.

BACKGROUND OF THE INVENTION

1. Field of the Invention

The present invention relates to a semiconductor device and a method for manufacturing the same.

2. Description of the Related Art

Due to progress in semiconductor technology, particularly in fine processing technology, the downsizing and increased capacitance of transistors and memory cells have rapidly advanced. For example, a device (hereinafter referred to a "vertical transistor") has been proposed which includes a transistor or memory cell using the side wall of a columnar semiconductor formed on a substrate. In the vertical transistor, the length direction of a gate of the transistor or memory cell agrees with the height direction thereof, so there is no occurrence of short-channel effects. Further, when elements are stacked in the height direction, high density can be implemented without increasing the area; thus it is use of the vertical transistor as an approach for implementing cost reduction and increased capacitance of a semiconductor device can be expected. Further, the vertical transistor has excellent features such that it is relatively easy to form an element of a partial depletion type structure or a perfect depletion type structure and such that a high-speed device or an element that consumes of lower power consumption can be formed using a field concentration effect. It has also been proposed that a DRAM (Dynamic Random Access Memory) with a memory cell having a unit memory cell size of 4 F2 (F being a design rule) be constructed using such a vertical transistor. In the 4 F2 type memory cell, a cross-point type layout is typically used in which a vertical transistor is arranged at the intersection of a word line and a bit line (refer to Japanese patent application Laid-Open Nos. 2007-329480 and 2002-026279).

Japanese patent application Laid-Open No. 2003-209187 discloses a layout in which bit lines are bent 30 degrees for each cell by utilizing a vertical transistor. In the layout in which bit lines are bent for each cell, patterning by lithography is extremely difficult to implement, compared to a layout in which bit lines are linear. Consequently, both the word line and bit line are preferably linear.

Meanwhile, electrical charges held in a DRAM capacitor disappear in the course of nature due to leak current. When electrical charges totally disappear, the data held in the capacitor cannot be retrieved. Thus, before electrical charges totally disappear, there is a need to rewrite electrical charges. Consequently, as the quantity of electrical charges capable of being accumulated in the capacitor increases, the number of rewrite times becomes smaller, allowing reduction of power consumption of DRAM. Accordingly, the capacitor capacitance of DRAM is preferably greater.

FIG. 1 is a plan view schematically illustrating arrangement of a word line, bit line and capacitor in a related art cross-point type memory cell. Referring to FIG. 1, circular capacitor 3 is arranged at the intersection of word line 1 and bit line 2. Word line 1 is patterned so that the line pitch equivalent to the sum of the width and the interval is Wa. Bit line 2 is patterned so that the line pitch equivalent to the sum of the width and the interval is Ba. Word line 1 is regularly arranged in a Y direction at a line pitch of Wa. Bit line 2 is regularly arranged in an X direction at a line pitch of Ba. When F denotes a minimum processing size (design rule) in manufacturing, word line pitch Wa and bit line pitch Ba are expressed as follows.

Word line pitch $Wa = 2 \times F$

Bit line pitch $Ba = 2 \times F$

That is, the word lines and bit lines are arranged so that the line pitches thereof are equal to each other.

In the case of a circular capacitor such as a cylinder type or pillar type capacitor, when the diameter (inside diameter) of the capacitor is R and the height thereof is H, capacitor capacitance C' is proportional to the product of the diameter and the height (C'=R×H). Referring to FIG. 1, when the space between the adjacent capacitors is S, capacitor diameter R is equal to $2 \times F - S (R = 2 \times F - S)$. As device miniaturization progresses, the minimum processing size (F) becomes smaller, so the capacitor diameter (R) also becomes smaller and the capacitor capacitance decreases. Consequently, the number of times of refresh operations (rewrite operations) increases, so the power consumption of DRAM becomes greater.

SUMMARY

According to the present invention, the diameter of the capacitor is enlarged while the same cell size as related art is used.

In one exemplary embodiment, there is provided a semiconductor device that includes: a plurality of first signal lines arranged in parallel with each other at a first line pitch; a plurality of second signal lines arranged in parallel with each other at a second line pitch greater than the first line pitch and intersecting with the first signal lines; and a plurality of capacitors having a center arranged above the first signal line, wherein the respective centers of the plurality of capacitors are displaced by a given distance from the intersection of the first signal line and the second signal line in a direction of arranging the second signal lines.

In another exemplary embodiment, there is provided a method for manufacturing a semiconductor device that includes: forming a plurality of first signal lines parallel to each other; forming a plurality of second signal lines parallel to each other and intersecting with the first signal lines; and forming a plurality of capacitors, wherein: the first signal lines are arranged at a first line pitch; the second signal lines are arranged at a second line pitch greater than the first line pitch; and the capacitors each have a center above the first signal line, and are arranged to be displaced by a given distance from an intersection of the first signal line and the second signal line in a direction of arranging the second signal lines.

BRIEF DESCRIPTION OF THE DRAWINGS

The above feature and advantages of the present invention will be more apparent from the following description of certain preferred embodiments taken in conjunction with the accompanying drawings, in which:

FIG. 7 is a cross-sectional view illustrating another process following the process illustrated in FIG. 6;

FIG. 9 is a cross-sectional view illustrating another process following the process illustrated in FIG. 8;

FIG. 11 is a cross-sectional view illustrating another process following the process illustrated in FIG. 10;

FIG. 12 is a cross-sectional view illustrating another process following the process illustrated in FIG. 11;

FIG. 13 is a cross-sectional view illustrating another process following the process illustrated in FIG. 12;

FIG. 16 is a cross-sectional view illustrating another process following the process illustrated in FIG. 15;

FIG. 17 is a cross-sectional view illustrating another process following the process illustrated in FIG. 16;

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purpose.

In a memory cell according to a first exemplary embodiment, the line pitch of word lines is greater than that of bit lines.

Figure 2:
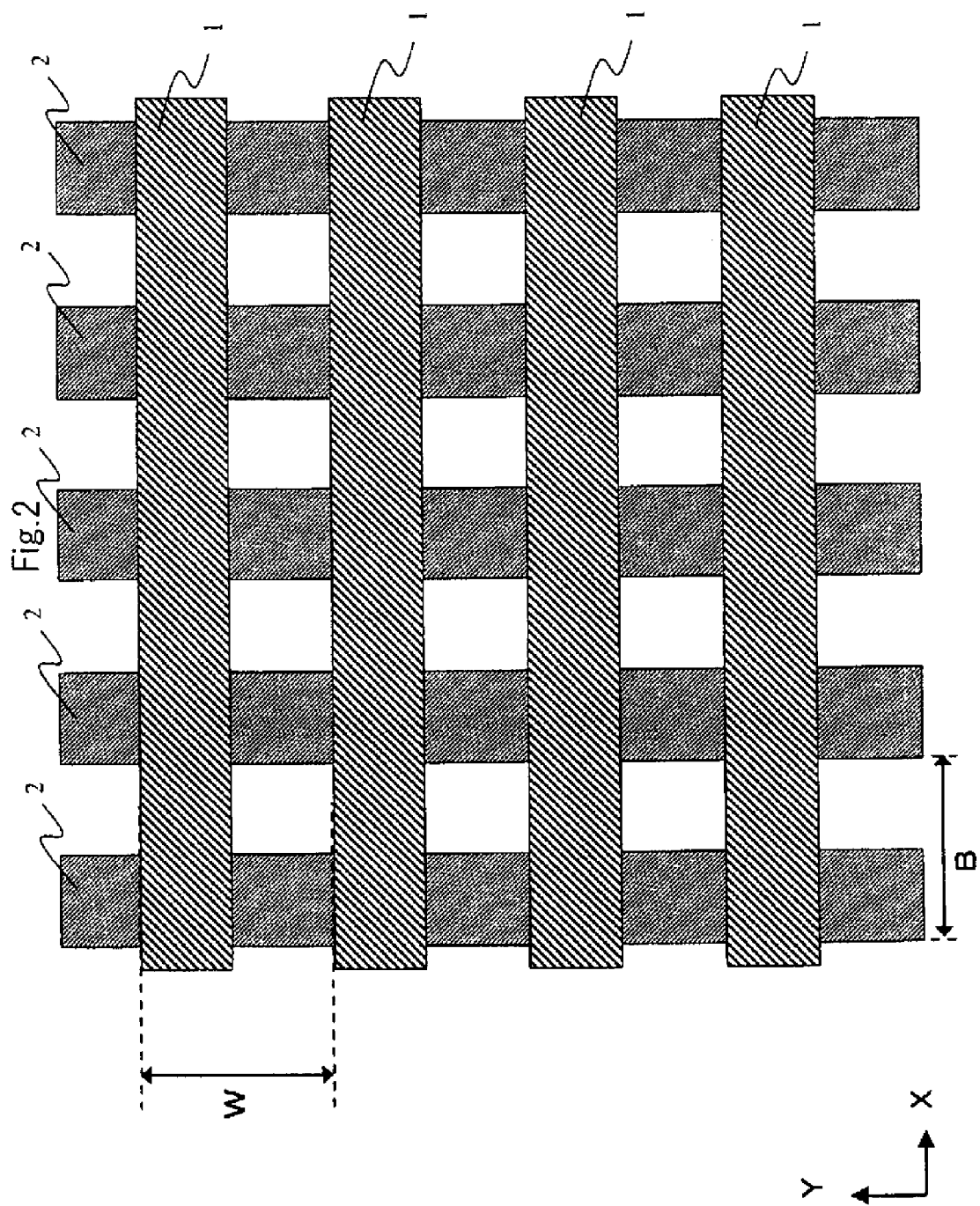
FIG. 2 is a plan view illustrating an example of arrangement of a word line and bit line in a semiconductor device according to the present invention.

Word lines 1 are, as illustrated in FIG. 2, regularly arranged in a Y direction at line pitch W; and bit lines 2 are regularly arranged in an X direction at line pitch B. Here, when F denotes a size (design rule) corresponding to a minimum processing size, bit lines 2 and word lines 1 are arranged so that bit line pitch B is equal to 2 F and word line pitch W is equal to 2.3 F. More precisely, the coefficient of 2.3 in the word line pitch of 2.3 F is $4/\sqrt{3}$ (=2.3094 ...).

For bit line 2, it is sufficient that the value obtained by adding the width and the interval is equal to 2 F; the respective values of the width and the interval are determined so as to be optimized according to manufacturing conditions and the like. For word line 1, it is sufficient that the value obtained by adding the width and the interval is equal to 2.3 F; the respective values of the width and the interval are determined so as to be optimized according to manufacturing conditions and the like.

Figure 3:
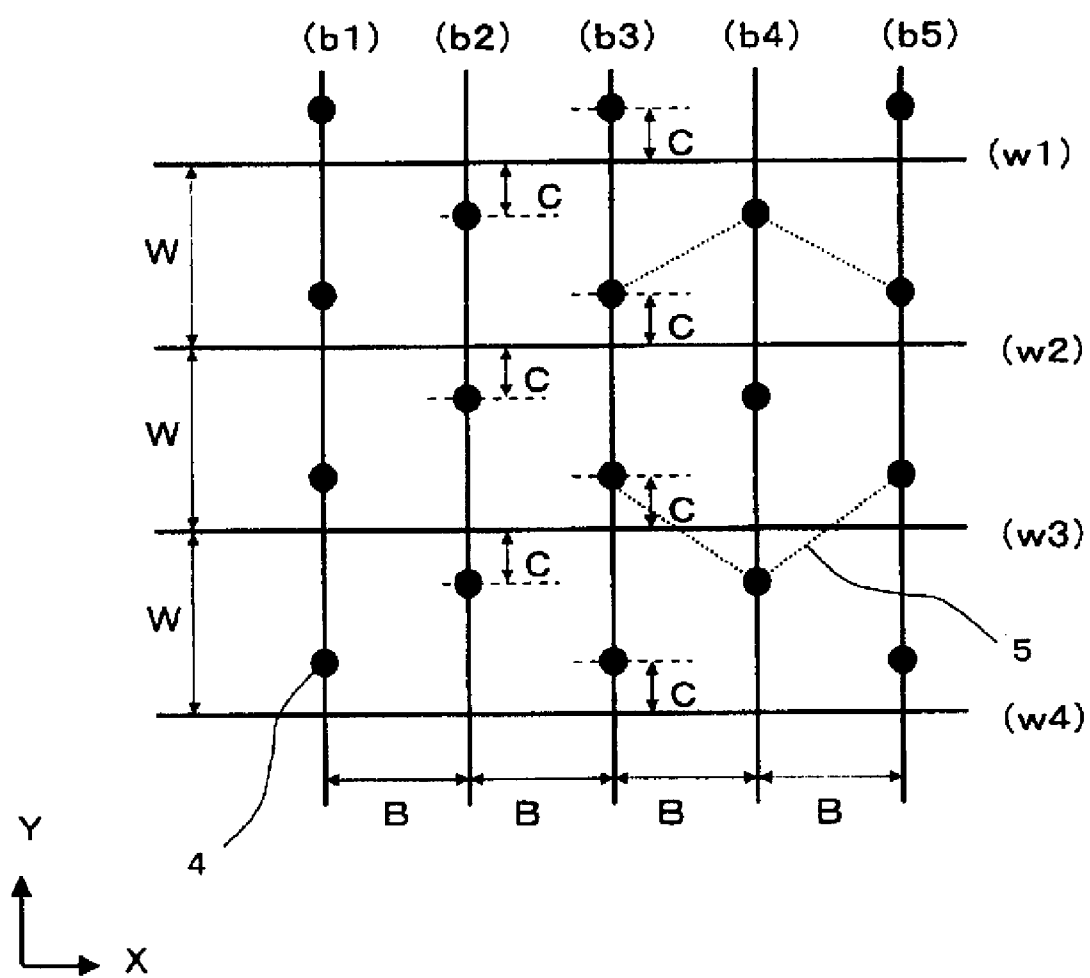
FIG. 3 is a plan view illustrating the position of a center of the capacitor in the semiconductor device illustrated in FIG. 2.

Further, the capacitors are arranged so that the distances between the centers of adjacent capacitors are equal to each other. FIG. 3 schematically illustrates four word lines w1 to w4 and five bit lines b1 to b5. The word lines are arranged at line pitch W and the bit lines are arranged at line pitch B. Capacitor center position 4 is indicated by a black circle. Capacitor center position 4 is displaced by distance C from an intersection of the word line and the bit line. Further, the direction in which capacitor center position 4 is displaced by distance C from the intersection of the word line and the bit line, is vertically reversed in FIG. 3. More specifically, capacitor center positions 4 on bit lines b1, b3 and b5 are displaced upward by distance C from the intersections relative to word lines w1 to 4w; and capacitor center positions 4 on bit lines b2 and b4 are displaced downward by distance C from the intersections relative to word lines w1 to 4w. With this arrangement, when six capacitor center positions 4 surrounding one capacitor are connected by a straight line, orthohexagon 5 is formed.

Figure 4:
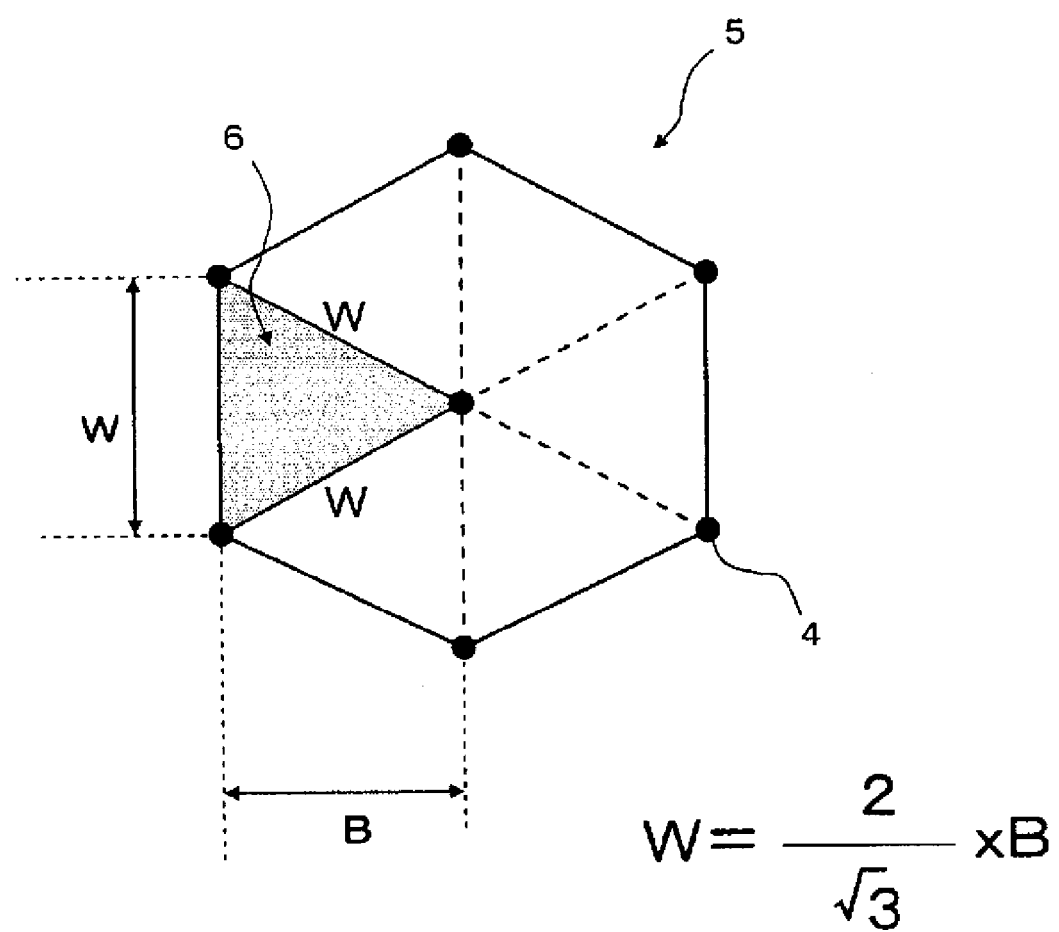
FIG. 4 is an enlarged view of an orthohexagon formed by connecting the centers of the capacitors illustrated in FIG. 2.

FIG. 4 is an enlarged view of orthohexagon 5. The length of one side of orthohexagon 5 is equal to word line pitch W. That is, the capacitors are arranged so that the spacing distances of center positions 4 are all equal to W, and when center positions 4 of the three adjacent capacitors are connected by a straight line, equilateral triangle 6 is formed. Consequently, when bit line pitch B is used, word line pitch W (=the length of one side of orthohexagon 5) is expressed as $(2/\sqrt{3}) \times B$ ($W=(2/\sqrt{3}) \times B$). Accordingly, when B is equal to 2 F, word line pitch W is set approximately to 2.3 F, whereby the arrangement illustrated in FIG. 3 is provided.

When capacitor center position 4 is displaced from the intersection of the word line and the bit line, the above distances C must be equal to each other in all the memory cells. Consequently, distance C is set to ¼ of the length of one side (W) of equilateral triangle 6 illustrated in FIG. 4. That is, $C=(1/2\sqrt{3}) \times B$.

Accordingly, when B is equal to 2 F, distance C is set approximately to 0.58 F, whereby the arrangement illustrated in FIG. 3 is provided. More precisely, the coefficient of 0.58 in distance C is $1/\sqrt{3}$ (=0.57735 ...).

Figure 5:
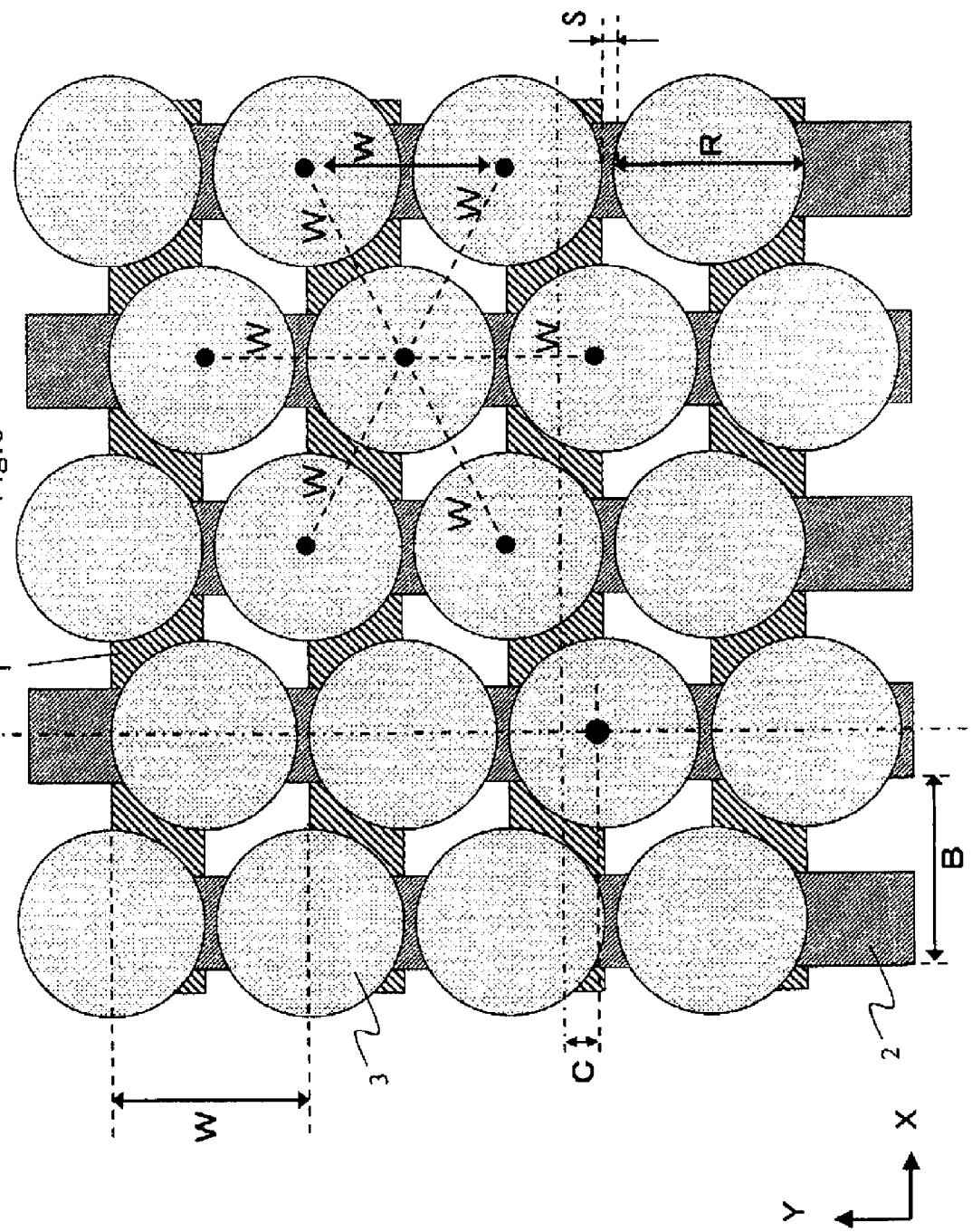
FIG. 5 is a plan view illustrating the arrangement of the capacitors in the semiconductor device illustrated in FIG. 2.

FIG. 5 illustrates capacitor 3 arranged in the above described manner. Word lines 1 are arranged in a Y direction at line pitch W, and bit lines 2 are arranged in an X direction at line pitch B.

Capacitor 3 is arranged so that it is displaced by distance C from the intersection of word line 1 and bit line 2. The direction in which capacitor 3 is displaced from the intersection is vertically reversed in FIG. 5 for each adjacent bit line. The distance between the centers of adjacent capacitors 3 are all equal to line pitch W of word line 1 in all of capacitors 3.

In order to implement the above layout, when F denotes a minimum processing size, B, W and C may be set as follows.

Line pitch $B$ of bit line 2=2 F

Line pitch $W$ of word line 1=2.3 F (more precisely, $(4/\sqrt{3}) \times F$)

Distance C=0.58 F (more precisely, $(1/\sqrt{3}) \times F$)

In the above description, the line pitch of the word line 1 is enlarged. However, the similar capacitor arrangement can be implemented when the line pitch of bit line 2 is enlarged to 2.3 F while the line pitch of word line 1 is maintained to 2 F. In this case, the center position of capacitor 3 is displaced in a direction parallel to bit line 2.

Advantageous effects of the capacitor arrangement according to the present invention will be described, compared to related art capacitor arrangement. Here, an arrangement will be illustrated in which the word line pitch is enlarged.

In the inventive capacitor arrangement, the word line pitch is enlarged, so the memory cell size can be expressed as 2 F×2.3 F=4.6 F².

Figure 1:
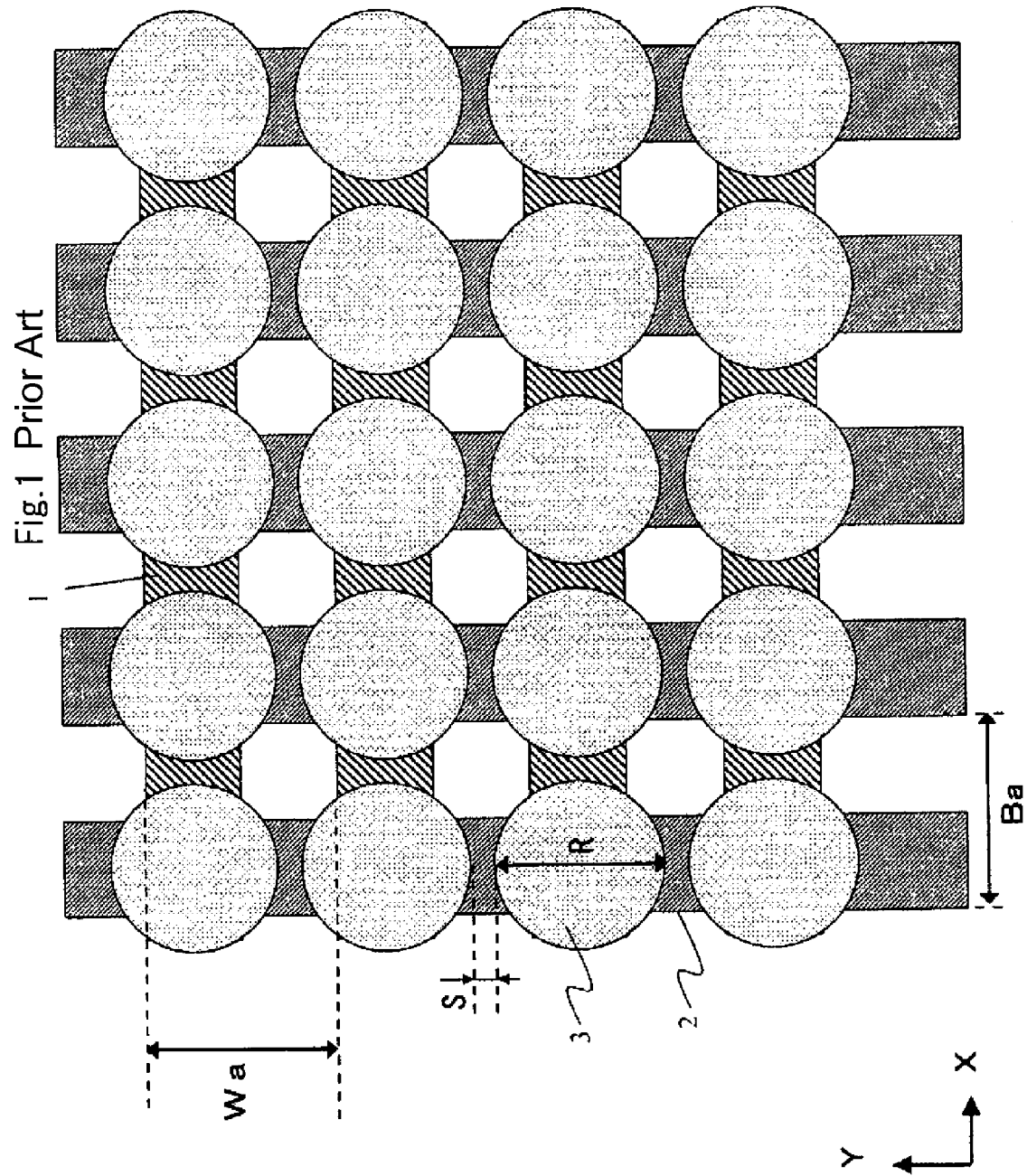
FIG. 1 is a plan view illustrating arrangement of a word line, bit line and capacitor in a related art cross-point type memory cell.

In related art memory cell arrangement, the line pitches of the word line and the bit line are each set to $\sqrt{4.6} \times F$ ($\cong 2.14$ F) to form a memory cell of the same size. In this case, from FIG. 1, capacitor diameter R is expressed as R=2.14 F−S (S being a space needed for separation of the capacitors).

However, in the inventive capacitor arrangement, from FIG. 5, capacitor diameter R is expressed as R=W−S=2.3 F−S (S being a space needed for separation of the capacitors).

From comparison between the two arrangements, it can be seen that the inventive capacitor arrangement allows enlargement of the capacitor size (diameter) even the size of cell remains the same.

Comparison will now be made using specific numerical values. For example, when F is equal to 50 [nm], S to 10 [nm] and the cell size to 11547 [nm²], while the capacitor diameter is 97.5 [nm] in related art capacitor arrangement, the capacitor diameter is 105.5 [nm] in the inventive capacitor arrangement.

As described above, according to the present invention, the capacitor size can be enlarged and the capacitor capacitance can be increased approximately 1.08 times.

An exemplary embodiment of the method for manufacturing the semiconductor device according to the present invention will now be described with reference to FIGS. 6 to 18. FIGS. 6(C) to 18(C) are each a plan view of a memory cell section of DRAM. FIGS. 6(A) to 18(A) are each a cross-sectional view of the memory cell section along the line A-A'. FIGS. 6(B) to 18(B) are each a cross-sectional view of the memory cell section along the line B-B'.

Figure 6C:
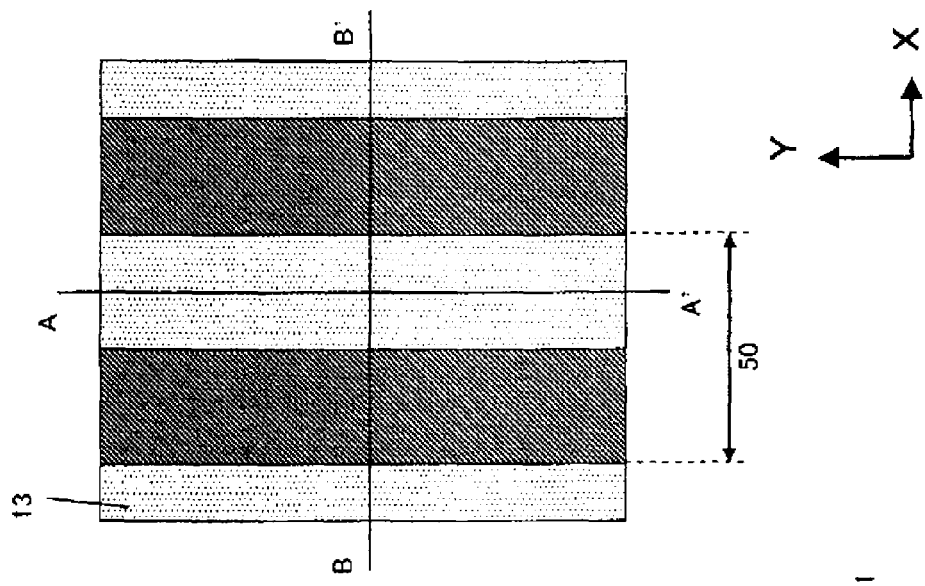
FIG. 6 is a cross-sectional view illustrating a process in a method of manufacturing the semiconductor device according to the present invention.
Figure 6B:
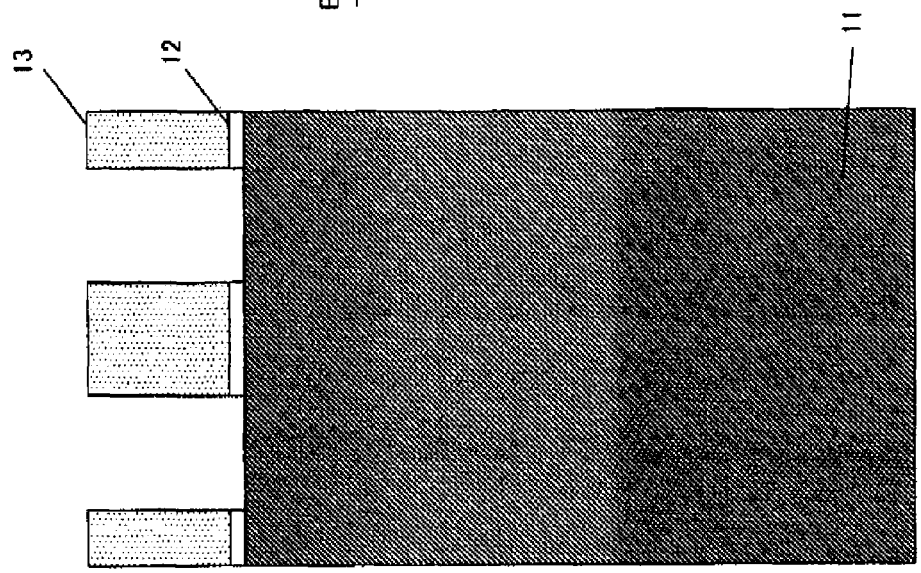
Figure 6A:
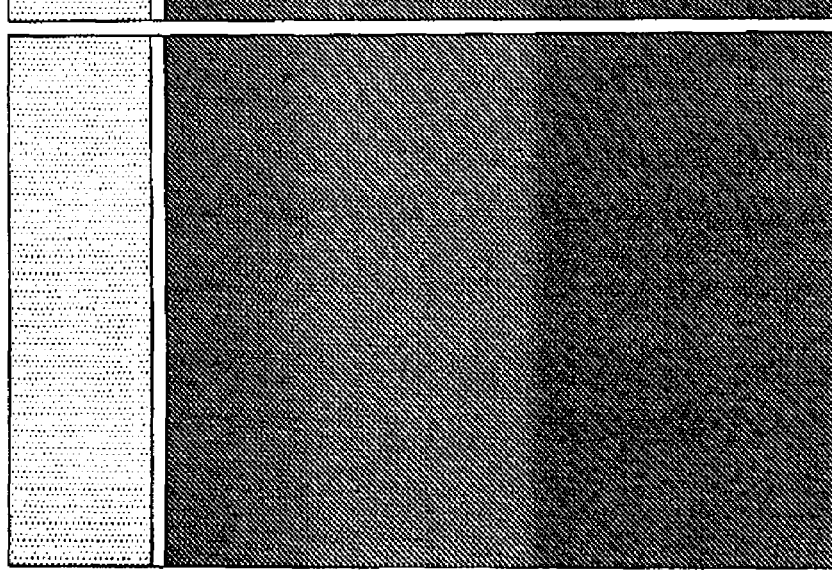

Referring to FIGS. 6(A) to 6(C), firstly, semiconductor substrate 11 of p-type silicon or the like is heated at a temperature of 1000 [° C.] and thermally oxidized, whereby silicon oxide film ($SiO_2$; hereinafter referred to as an oxide film) 12 having a thickness of 5 [nm] is formed. Subsequently, silicon nitride film ($Si_3N_4$; hereinafter referred to as a nitride film) 13 having a thickness of 100 [nm] is accumulated by CVD. Subsequently, a photoresist mask (not illustrated) used to pattern nitride film 13 and oxide film 12 is formed by use of a photolithography technique. The photoresist mask is formed so that nitride film 13 and oxide film 12 can be etched to have a shape extending linearly in a Y direction as illustrated in FIG. 6(C). Further, the photoresist mask is formed so that pitch 50 illustrated in FIG. 6(C) is set to 2 F (F being a minimum processing size). Subsequently, nitride film 13 and oxide film 12 are dry etched using the photoresist as a mask. Subsequently, the photoresist mask is removed.

Subsequently, referring to FIG. 7, silicon (semiconductor substrate 11) is dry etched by 130 [nm] using nitride film 13 as a mask. Subsequently, semiconductor substrate 11 is thermally oxidized at a temperature of 1000 [° C.] to form oxide film 14 having a thickness of 5 [nm]. Subsequently, oxide film 15 having a thickness of 5 [nm] is formed by CVD. Oxide film 15 and oxide film 14 are etched back, so that a silicon surface of semiconductor substrate 11 is exposed in a region not covered with nitride film 13.

Figure 8C:
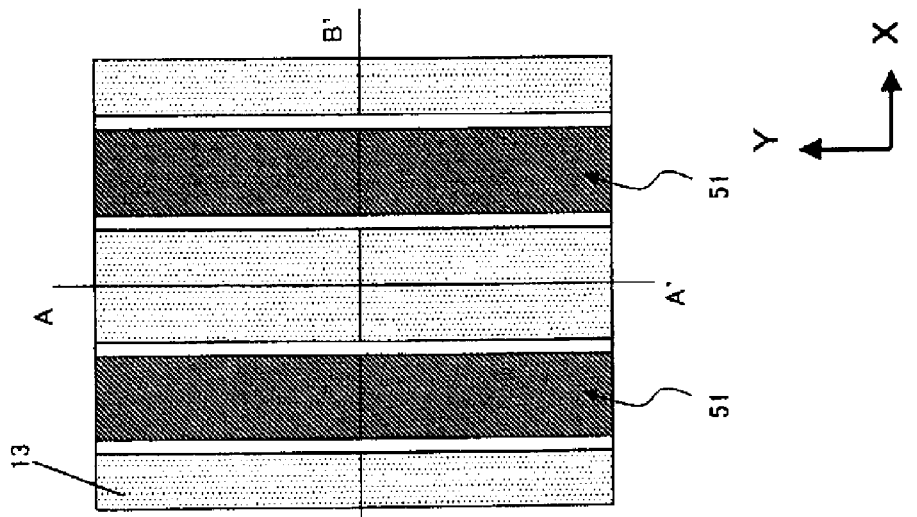
FIG. 8 is a cross-sectional view illustrating another process following the process illustrated in FIG. 7.
Figure 8B:
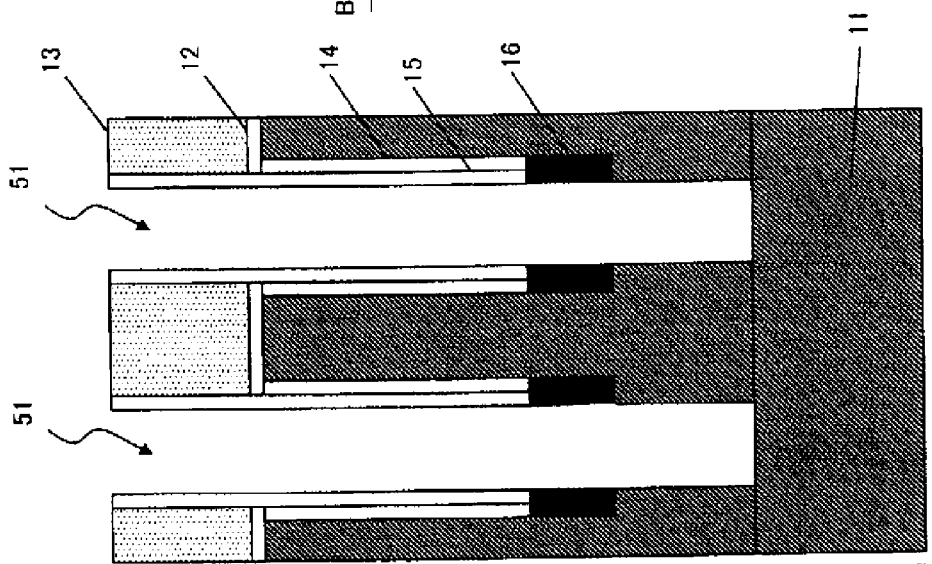
Figure 8A:
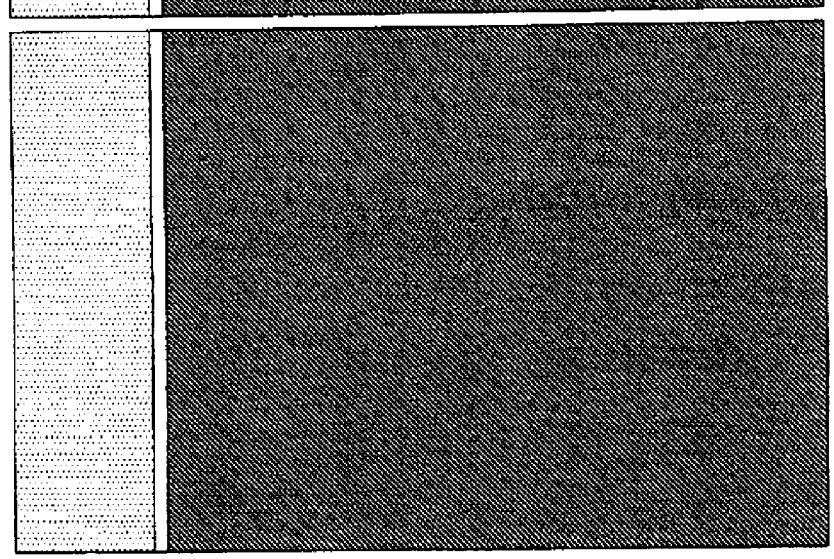

Subsequently, referring to FIG. 8, ion is implanted to form a bit line. More specifically, arsenic (As) is implanted by a dose amount of 1E15 [atoms/cm²] using an accelerating energy of 25 [KeV]. Thereafter, a thermal process is performed at a temperature of 1000 [° C.] to activate the ion. The arsenic that is also diffused in a lateral direction by the thermal process forms n-type dopant diffusion layer (hereinafter referred to as a diffusion layer) 16. Thereafter, silicon dry etching is performed by 100 [nm] to form groove pattern 51 extending in a Y direction. Diffusion layer 16 extends in an A-A' direction and functions as the bit line.

Referring to FIG. 9, semiconductor substrate 11 is thermally oxidized at a temperature of 1000 [° C.] to form an oxide film (not illustrated) having a thickness of 3 [nm]. Subsequently, oxide film 17 is accumulated in the inner side of groove pattern 51 by CVD.

Figure 10A:
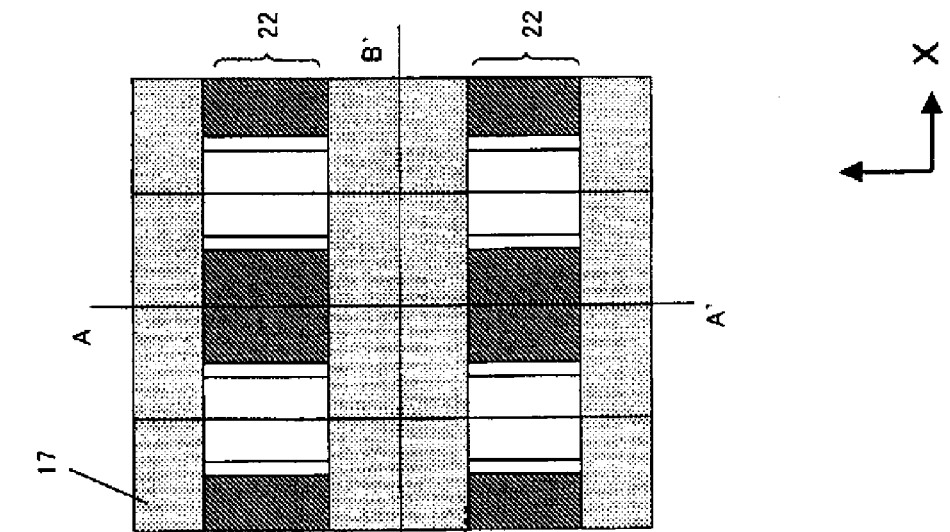
FIG. 10 is a cross-sectional view illustrating another process following the process illustrated in FIG. 9.
Figure 10B:
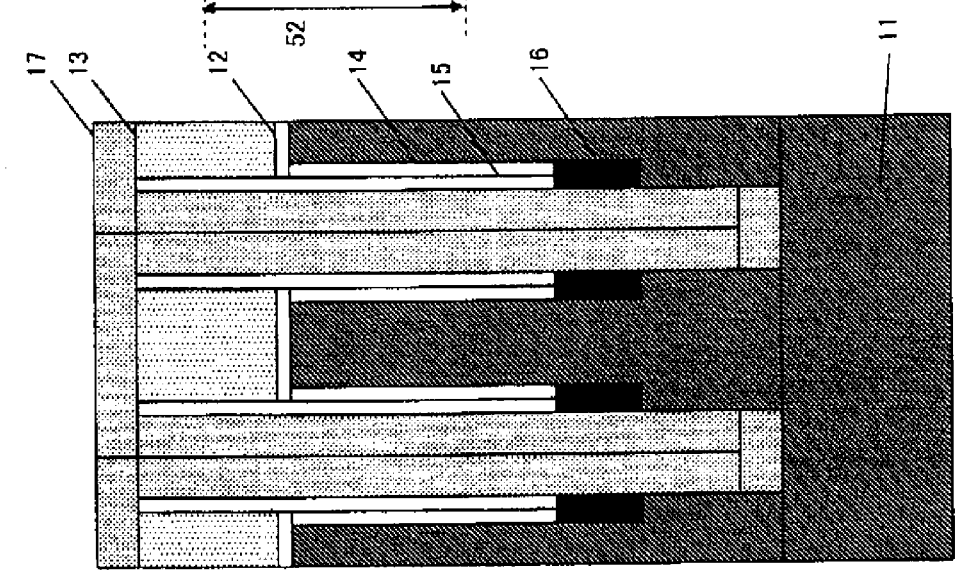
Figure 10C:
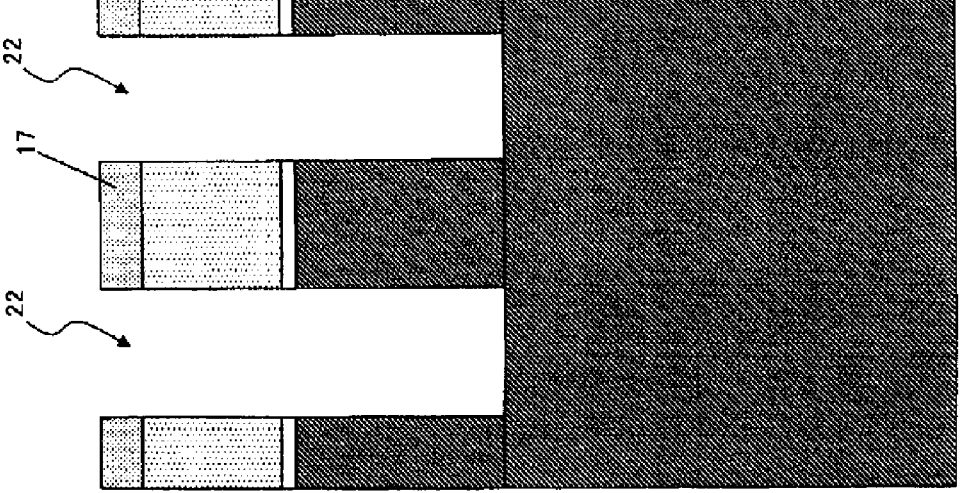

Subsequently, referring to FIG. 10, using a photolithography technique, a photoresist mask (not illustrated) is formed which is used to form groove pattern 22 extending in a direction (X direction) perpendicular to groove pattern 51. In this case, pitch 52 illustrated in FIG. 10(C) is set to $(4/\sqrt{3})$ F$\cong$2.3094 F. Subsequently, oxide film 17, nitride film 13 and oxide film 12 are dry etched using the photoresist as a mask, and then the photoresist is removed. Subsequently, the silicon (semiconductor substrate 11) is dry etched by 100 [nm] using oxide film 17 and nitride film 13 as a mask.

Subsequently, referring to FIG. 11, oxide film 18 is accumulated by HDP-CVD (High Density plasma CVD). In the accumulation of oxide film 18 by HDP, the oxide film tends to accumulate more in a vertical direction than in a side surface section. Here, an illustration of an oxide film accumulated in a side surface section of the groove pattern 22 is omitted.

Subsequently, referring to FIG. 12, oxide film wet etching is performed to expose a side wall (silicon) of groove pattern 22 (FIG. 11(A)). Subsequently, thermal oxidization is performed at a temperature of 1000 [° C.] to form gate insulating film 30. Subsequently, ion is implanted in semiconductor substrate 11 to form lower diffusion layer 25. More specifically, arsenic (As) is implanted by a dose amount of 1E15 [atoms/cm²] using an accelerating energy of 30 to 60 [KeV]. In this case, the accelerating energy in the ion implantation is adjusted so that conduction between lower diffusion layer 25 and the bit line (diffusion layer 16) is made.

Subsequently, referring to FIG. 13, polysilicon 19a is accumulated as a gate electrode material. Subsequently, the surface of polysilicon 19a is polished and flattened by CMP (Chemical Mechanical Polishing).

Figure 14C:
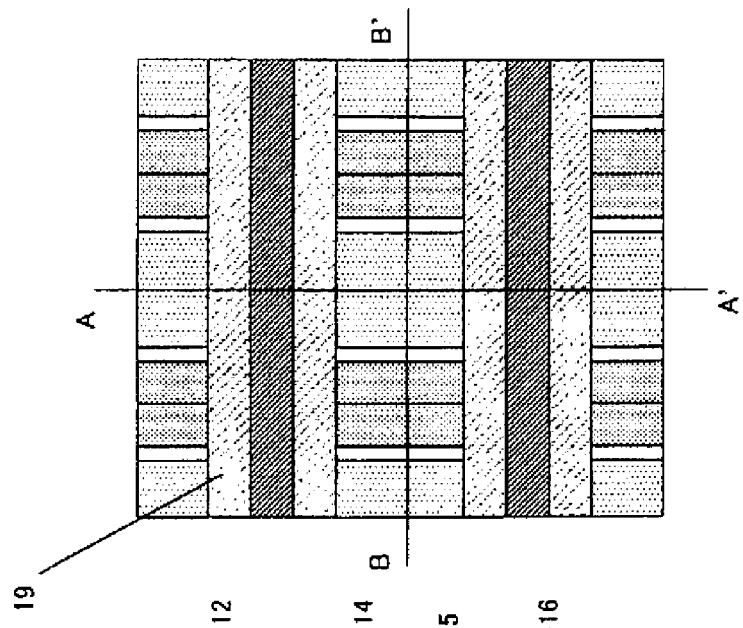
FIG. 14 is a cross-sectional view illustrating another process following the process illustrated in FIG. 13.
Figure 14B:
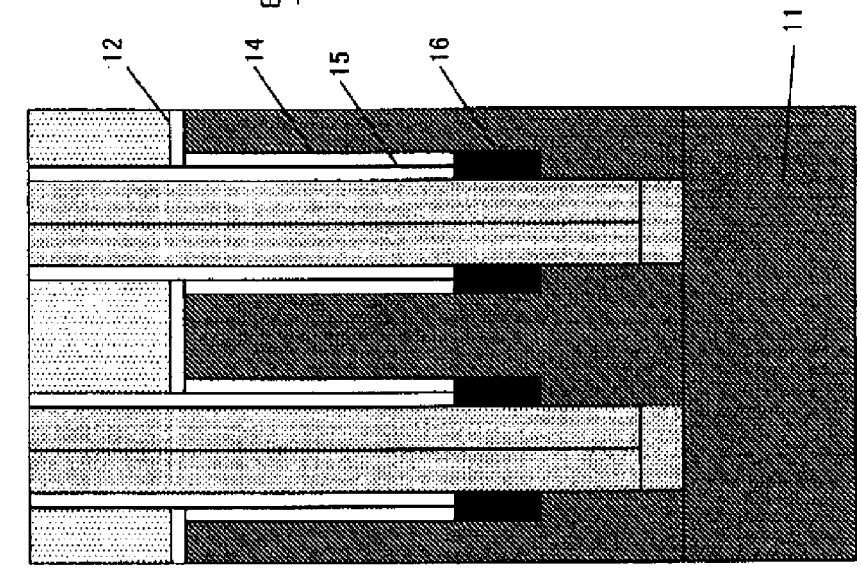
Figure 14A:
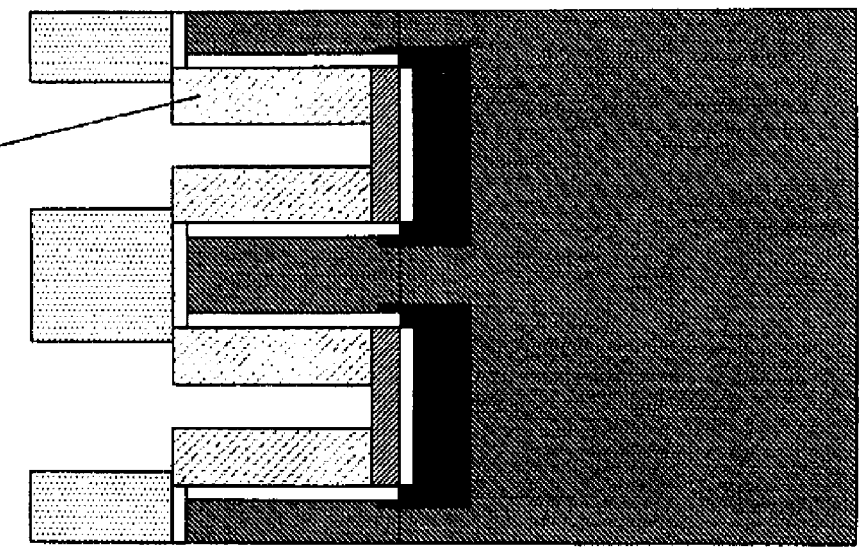

Referring to FIG. 14, polysilicon 19a is patterned by a photolithography technique. Thereafter, polysilicon 19a is divided by dry etching to form adjacent gate electrodes 19. Subsequently, gate electrode 19 is etched back so that the height of gate electrode 19 is approximately equal to that of semiconductor substrate 11.

Subsequently, referring to FIG. 15, the space between the layers is filled with oxide film 20 to cover gate electrode 19 (FIG. 14). Subsequently, the surface is flattened by CMP.

Figure 15A:
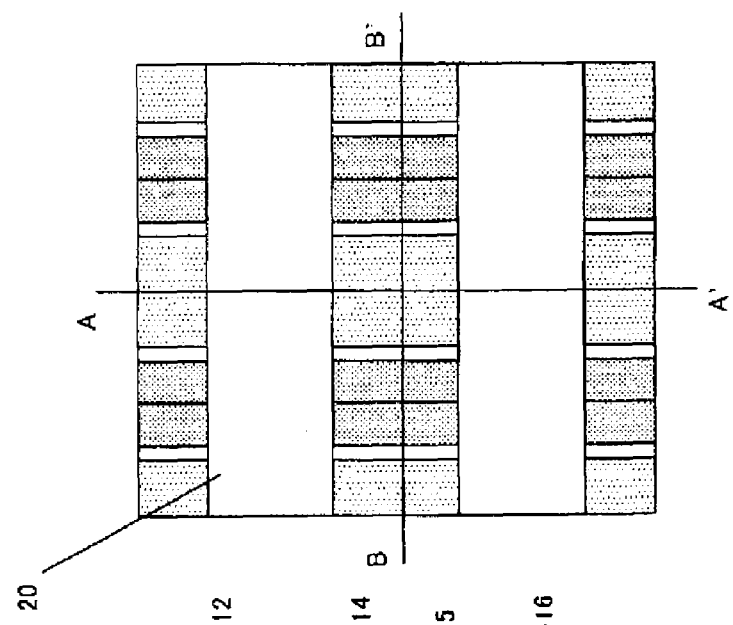
FIG. 15 is a cross-sectional view illustrating another process following the process illustrated in FIG. 14.
Figure 15B:
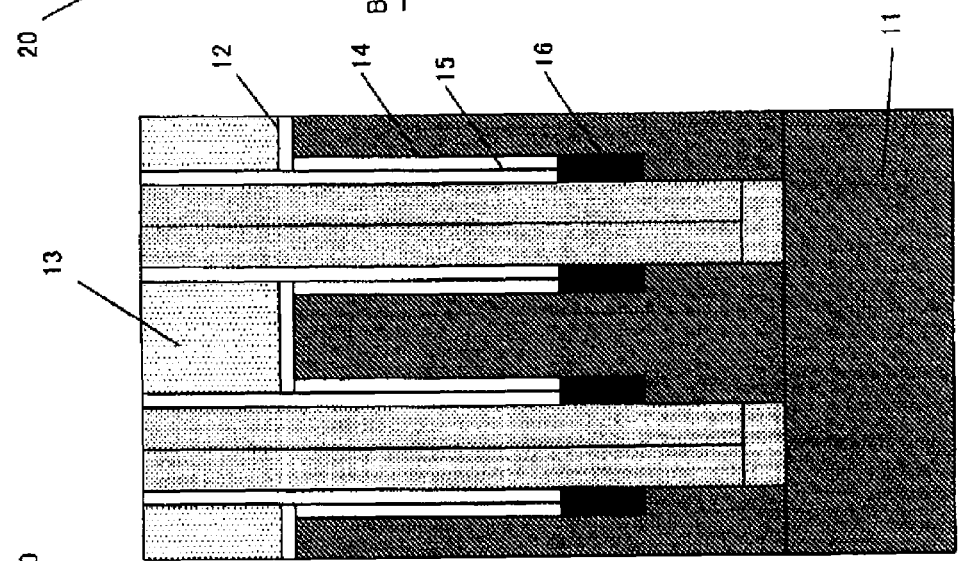
Figure 15C:
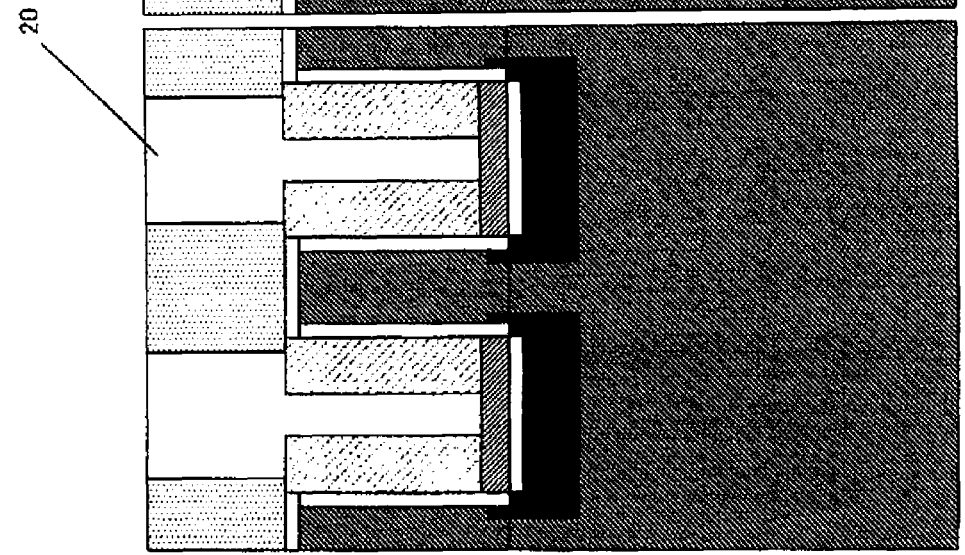
Figure 18C:
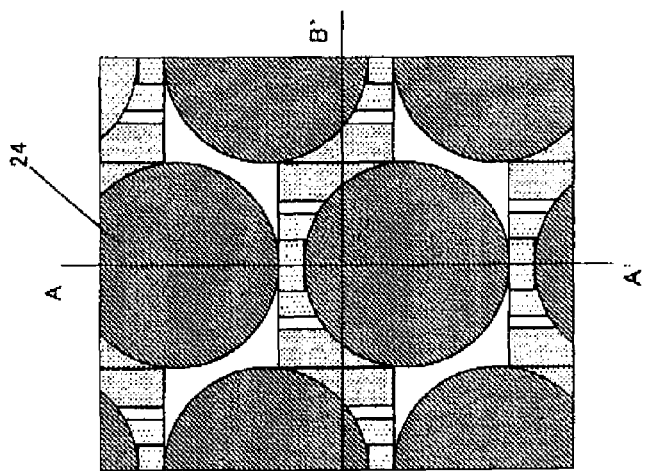
FIG. 18 is a cross-sectional view illustrating another process following the process illustrated in FIG. 17.
Figure 18B:
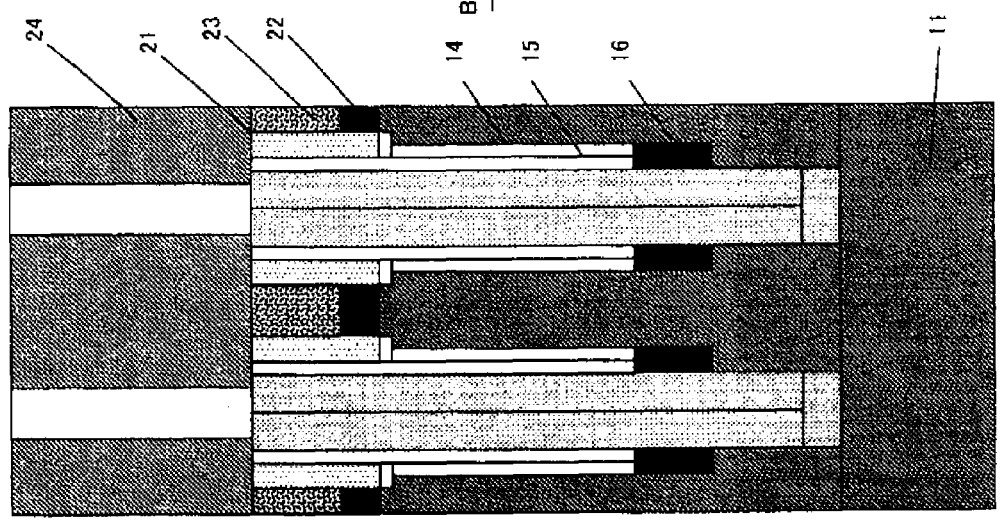
Figure 18A:
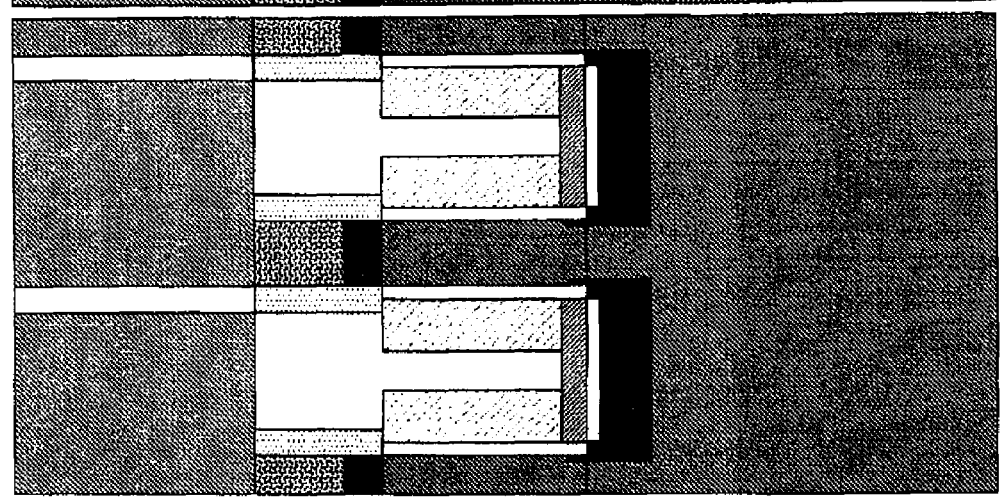

Subsequently, referring to FIG. 16, nitride film 13 illustrated in FIG. 15 is removed by wet etching using thermal phosphoric acid. Thereafter, nitride film is accumulated, and etching-back is performed to form side wall 21. As a result, a part of the silicon surface of semiconductor substrate 11 is exposed.

Subsequently, referring to FIG. 17, a silicon layer having a film thickness of 30 [nm] is formed by a selective epitaxial growth method in a region where the silicon surface is exposed. Thereafter, ion is implanted in the formed silicon layer to form an upper diffusion layer. More specifically, arsenic (As) is implanted by a dose amount of 1E15 [atoms/cm$^2$] using an accelerating energy of 10 [KeV]. Subsequently, a conductive material is fed onto the upper diffusion layer to form contact plug 23.

Subsequently, referring to FIG. 18, an interlayer film is formed and capacitor 24 is formed so that the above described arrangement is provided. Reference numeral 24 in FIG. 18 denotes a lower electrode of the capacitor. Here, lower electrode 24 of the capacitor is either of a cylinder type or of a pillar type. Thereafter, a peripheral circuit section is formed. After the above described processes, the semiconductor device is completed.

Figure 19:
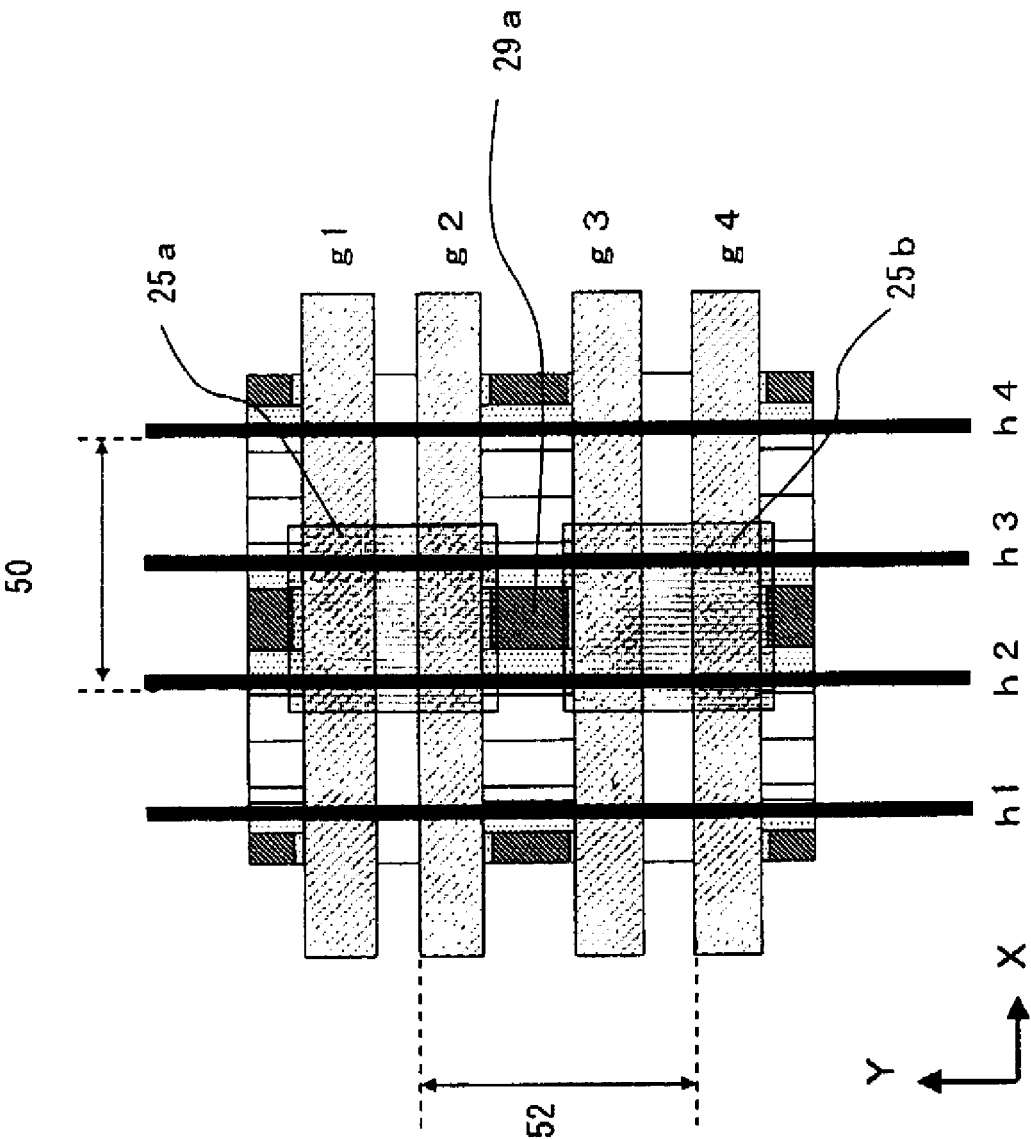
FIG. 19 is a plan view illustrating an exemplary structure of a memory cell manufactured according to the manufacturing method including the processes illustrated in FIGS. 6 to 18.

The structure of the memory cell will be described with reference to FIG. 19. Lines g1 to g4 extending in an X direction used for the gate electrode are arrayed in a Y direction. Lines h1 to h4 extending in a Y direction formed of an n-type dopant layer are arrayed in an X direction. Reference numerals 25a and 25b each denote a lower diffusion layer connected to silicon pillar 29a formed in the central part. Lines g2 and g3 for the gate electrode are arranged to have therebetween pillar 29a via the gate insulating film. When lines g2 and g3 have the same electrical potential, lines g2 and g3 function as a single word line.

Lines h2 and h3 are both connected to lower diffusion layers 25a and 25b. Two lines h2 and h3 function as a single bit line. The line pitch of the bit line is represented by arrow 50, and the line pitch of the word line, by arrow 52. The line pitch of the bit line (50) is set to 2 F, and the line pitch of the word line (52), to $(4/\sqrt{3})F$.

Figure 20:
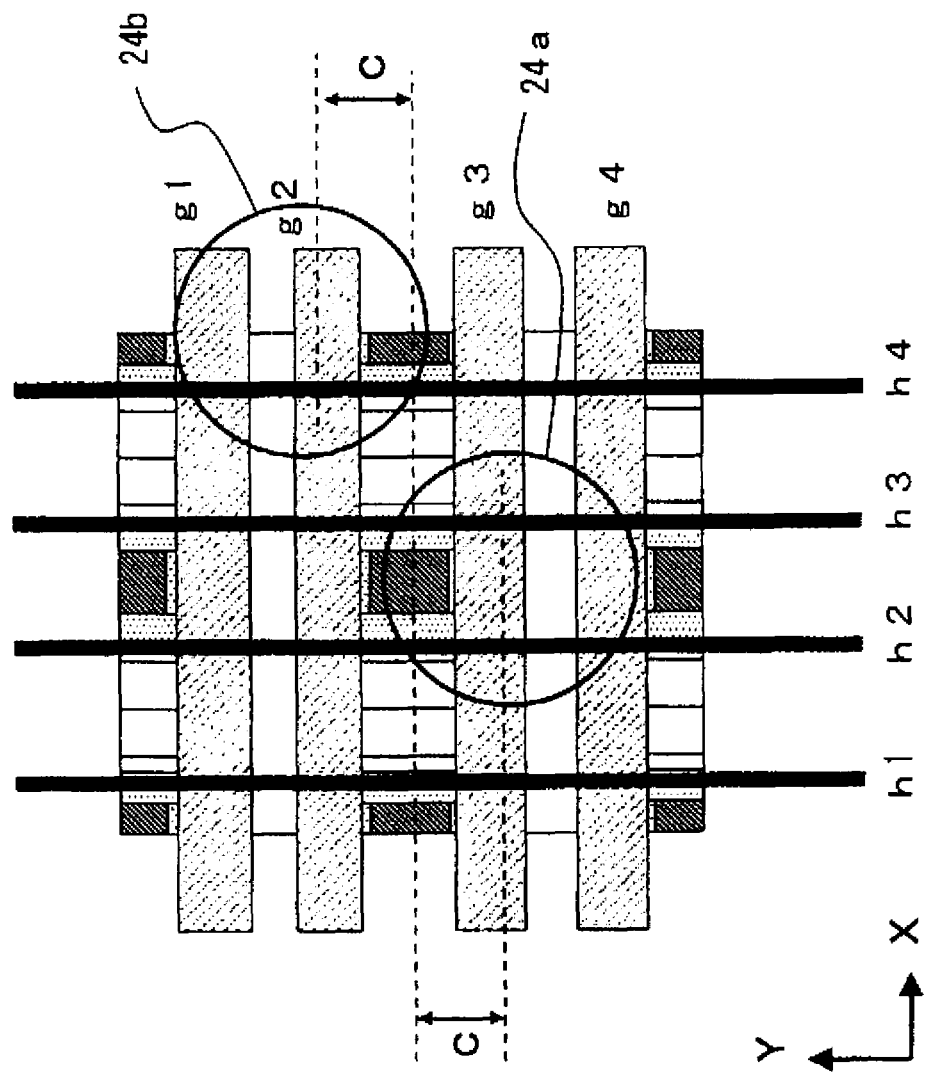
FIG. 20 is a plan view illustrating the arrangement of a capacitor in the memory cell manufactured according to the manufacturing method including the processes illustrated in FIGS. 6 to 18.

The capacitor arrangement will be described with reference to FIG. 20. The capacitors are arranged so that they are displaced in a direction (Y direction) of arraying the word lines. The center position of capacitor 24a connected to silicon pillar 29a (FIG. 19) is displaced downward by distance C from the center position of the word lines (lines g2 and g3); and the center position of adjacent capacitor 24b is displaced upward by distance C from the center position of the word lines. Distance C is set to $(1/\sqrt{3})F$.

Figure 21:
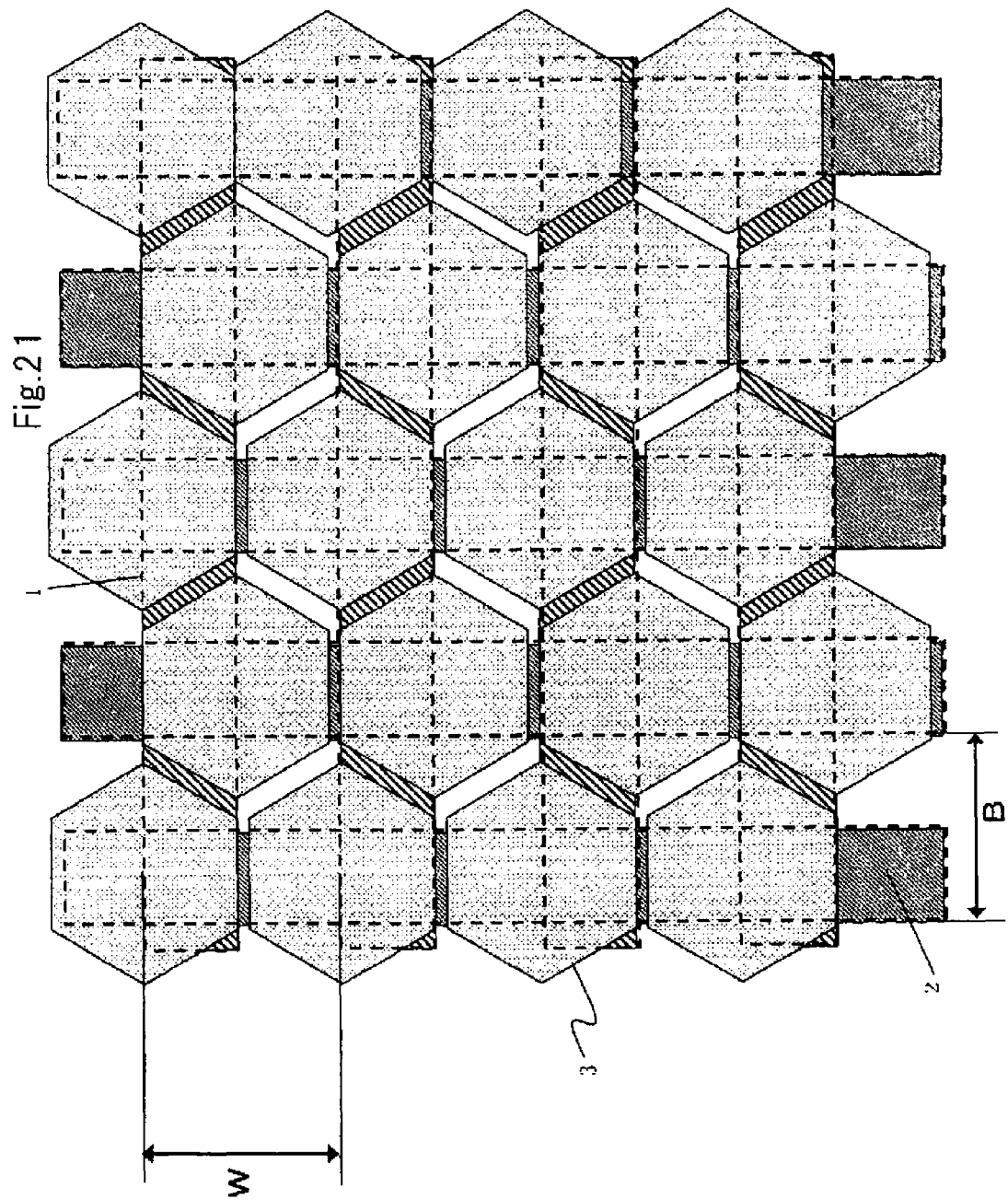
FIG. 21 is a plan view illustrating a variation of the capacitor.

The planar shape of the capacitor is not limited to circular. For example, the planar shape of the capacitor may be, as illustrated in FIG. 21, hexagonal; or the planar shape of the capacitor may have six or more corners, that is, polygonal. In the configuration illustrated in FIG. 21, by way of example, line pitch W of word lines 1 is set to $(4/\sqrt{3})\times F (\approx 2.3094\,F)$, and line pitch B of bit lines 2, to 2 F.

Figure 22:
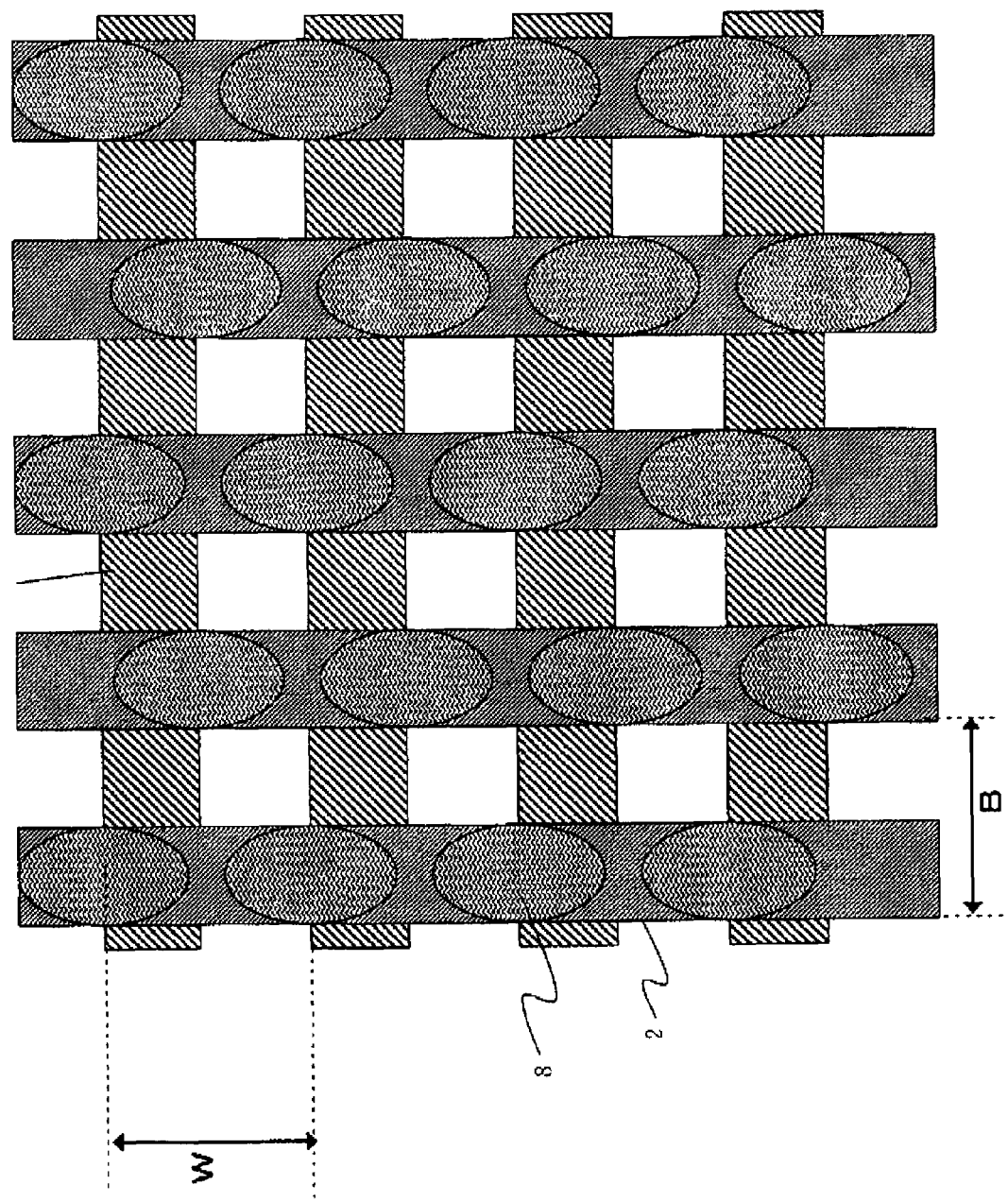
FIG. 22 is a plan view illustrating an exemplary layout in which a silicon pillar and a lower electrode of the capacitor are connected via a conductive pat formed under the capacitor.
Figure 23C:
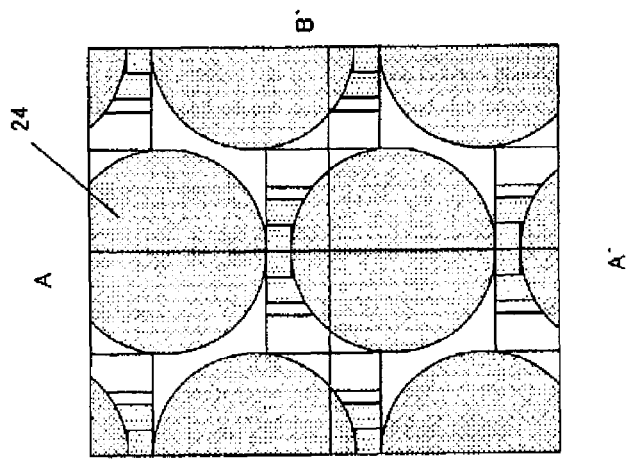
FIG. 23 is a plan view illustrating an exemplary layout in which a silicon pillar and a lower electrode of the capacitor are connected via a conductive pat formed under the capacitor in the configuration illustrated in FIG. 18.
Figure 23B:
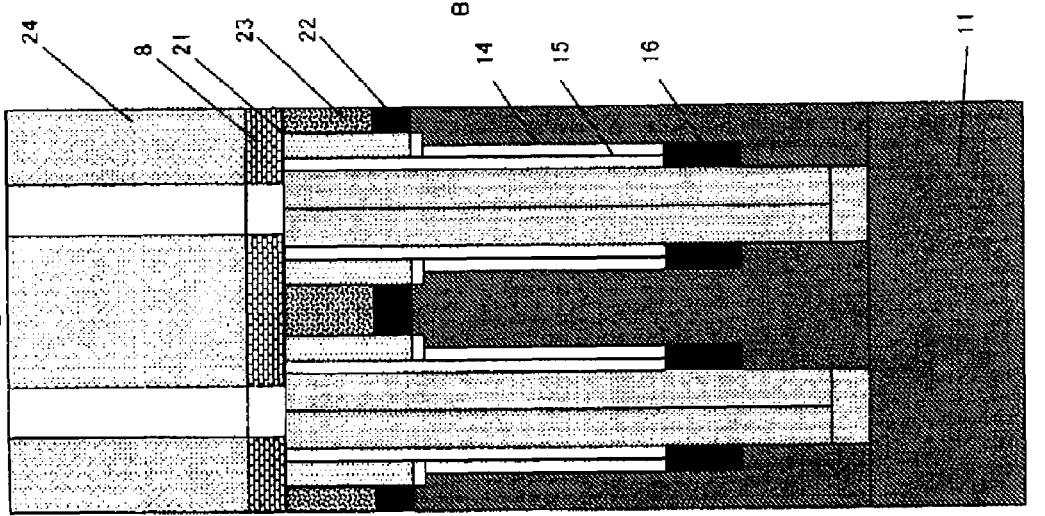
Figure 23A:
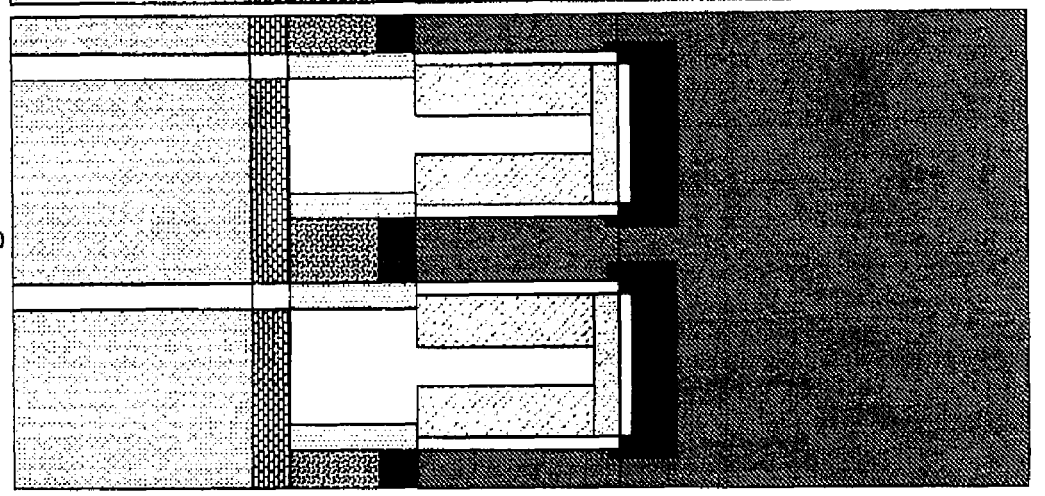

The height of the capacitor may be extremely great. When the height of the capacitor is extremely great, in forming the electrode, it may be difficult to make a uniform hole in the interlayer insulating film. Thus, a conductive pat may be formed under the capacitor through which the silicon pillar and the lower electrode of the capacitor are connected. FIG. 22 illustrates an exemplary layout in which pat 8 is formed. FIG. 23 is a cross-sectional view illustrating an exemplary configuration in which pat 8 is added to the configuration illustrated in FIG. 19.

When the pat is provided, the allowable range of displacement of the silicon pillar from the lower electrode of the capacitor is enlarged when position adjustment between the silicon pillar and the lower electrode is performed.

The above description is about a case in which the line pitch of the word line may be enlarged. However, the line pitch of the bit line, not of the word line may be enlarged. In this case, the capacitor may be arranged so that it is displaced in a direction (X direction in the drawings) of arraying the bit lines. The distance by which the capacitor is displaced is similar to the when the line pitch of the word line is enlarged.

The structure of the vertical MOS transistor described in the above is an example only. The present invention is applicable to the entire cross-point type memory cell layout. The lines that configure bit line or word line of the vertical MOS transistor may be only arranged on the one side of each pillar. When the present invention is applied to the structure in which the lines configure word lines are only arranged on the one side of each pillar, please regard the locations where the pillars are arrange and the lines, that are arrange in the vicinity of the pillars, as the location where the word lines are arranged. When the present invention is applied to the structure in which the lines configure bit lines are only arranged on the one side of each pillar, please regard the locations where the pillars are arrange and the lines, that are arrange in the vicinity of the pillars, as the location where the bit lines are arranged.

According to the present invention, the gate electrode may be formed of polysilicon, amorphous silicon or metal. In particular, the gate electrode may be formed of a material containing tungsten (W), tungsten silicide (WSi) or titanium nitride (TiN). The gate electrode may be formed of another metal material. The gate electrode may be formed of another conductive substance.

According to the present invention, the bit line may be formed of silicon (dopant diffusion layer) or metal. In particular, the bit line may be formed of a material containing W, WSi or TiN. The bit line may be formed of another metal material. The bit line may be formed of another conductive substance.

According to the present invention, the gate insulating film may be oxide film, oxynitride film or another high dielectric constant insulating film (High-k insulating film). In particular, the high dielectric constant insulating film may contain hafnium (Hf). The gate insulating film may be another insulating film.

According to the present invention, the interlayer film may be replaced with an insulating material such as oxide film, nitride film, SIOC or SiON.

The present invention may be applied to a consolidated logic product including a DRAM element and logic element mounted on one chip, or to a memory or the like with a ferroelectric capacitor.

When a MOS transistor and a storage element connected thereto constitute a memory cell, the present invention may be applied to a phase change memory element (PRAM), resistance memory element (ReRAM) or the like, for example.

Specific examples of storage elements include an element in which, when current flows between electrodes, the resistance value across the electrodes varies and after the current flow is stopped, the varied resistance value is kept. In such an element, a chalcogenide material such as GeSbTe, or a perovskite metal oxide material is placed between the two electrodes.

In the above storage element, when the area for arranging the storage element is reduced for downsizing, it is difficult to maintain the performance of the storage element. However, when the storage element is arranged according to the present invention, the area for arranging the storage element can be enlarged while downsizing is achieved. More specifically, a storage element is arranged according to the present invention, and either a source or drain electrode of a vertical MOS transistor is connected to the storage element. Further, a line working as a bit line or ground line (GND line) is connected to the remaining source or drain electrode of the vertical MOS transistor, and arranged according to the above described bit line layout.

Further, a line connected to the gate electrode of the MOS transistor is arranged according to the above described word line layout.

When the storage element is arranged in this way, a semiconductor device with a high-performance storage element can be formed while downsizing is achieved.

It is apparent that the present invention is not limited to the above embodiments, but may be modified and changed without departing from the scope and spirit of the invention.

What is claimed is:

1. A semiconductor device comprising:
at least three first signal lines arranged sequentially in parallel with each other at a first line pitch;
at least three second signal lines arranged in parallel with each other at a second line pitch and overlapping with the first signal lines as viewed in plan view; and
a plurality of capacitors, each capacitor being arranged above an associated one of the first signal lines and being arranged over an associated one of the second signal lines, each capacitor of the plurality of capacitors being arranged with respect to a point where the associated one of the first signal lines overlaps with the associated one of the second signal lines when viewed in plan view,
wherein each capacitor of the plurality of capacitors is displaced from the point where the associated one of the first signal lines overlaps with the associated one of the second signal lines when viewed in plan view, only in a direction parallel to a longitudinal direction of the first signal lines.

2. The semiconductor device according to claim 1, wherein the first line pitch is twice a minimum processing size defined by a design rule, and the second line pitch is $4/\sqrt{3}$ times the minimum processing size, and wherein each capacitor of the plurality of capacitors is displaced by a distance of $1/\sqrt{3}$ times the minimum processing size from the overlapping point of the associated one of the first signal line and the associated one of the second signal line.

3. The semiconductor device according to claim 1, wherein one of the first signal lines is a bit line and one of the second signal lines is a word line.

4. The semiconductor device according to claim 3,
wherein the word line comprises a first word layer and a second word layer, the first word layer being disposed facing to the second word layer with an intervention of a semiconductor pillar formed at an overlapping point when viewed in plan view of the word line and the bit line therebetween, the first word line and the second word line being configured to function as a single word line, and
wherein the bit line comprises a first bit layer and a second bit layer, the first bit layer being disposed facing to the second bit layer with an intervention of the semiconductor pillar formed at the overlapping point when viewed in plan view of the word line and the bit line therebetween.

5. The semiconductor device according to claim 1,
wherein the first signal lines comprise a first line, a second line and a third line,
wherein a center of one of the capacitors associated with one of the second signal lines above the first line or the third line is displaced in a first direction, and a center of a capacitor associated with one of the second signal lines above the second line is displaced in a second direction opposite to the first direction, and
wherein the first signal lines and the second signal lines overlap orthogonally.

6. The semiconductor device according to claim 5, wherein the plurality of capacitors are arranged so that the centers of six of the capacitors surrounding a given capacitor form a regular hexagon.

7. The semiconductor device according to claim 5,
wherein the first to third lines are adjacently arranged, and
wherein the second line pitch is greater than the first line pitch.

8. The semiconductor device according to claim 1, further comprising:
a plurality of vertical MOS transistors associated with the capacitors, wherein each of the vertical MOS transistors has a lower diffusion layer in a semiconductor substrate, an upper diffusion layer on a top surface of the semiconductor substrate and a gate electrode on a side surface of the semiconductor substrate,
wherein one of the capacitors is connected to the upper diffusion layer on the substrate,
wherein one of first signal lines is connected to the lower diffusion layer, and
wherein one of the second signal line is connected to the gate electrode.

9. A semiconductor device comprising:
at least three first signal lines having a first line, a second line, and a third line extended to a first direction and arranged sequentially in parallel with each other, the first and second lines being arranged at a first line pitch, and the second and third lines being arranged at the first line pitch;
at least three second signal lines having a fourth line, a fifth line, and a sixth line extended to a second direction perpendicular to the first direction and arranged sequentially and in parallel with each other, the fourth and fifth lines being arranged at a second line pitch, and the fifth and sixth lines being arranged at the second line pitch and overlapping with the first signal lines as viewed in plan view; and
at least seven storage elements each having a center associated with one of the first signal lines and one of the second signal lines,
wherein a first storage element is associated with the first line and the fourth line, a second storage element is associated with the second line and the fourth line, a third storage element is associated with the third line and fourth line, a fourth storage element is associated with the first line and fifth line, a fifth storage element is associated with the second line and fifth line, a sixth storage element is associated with the third line and fifth line, and a seventh storage element is associated with the second line and sixth line,
wherein the center of each of the first, the fifth and the sixth storage elements is arranged on a first straight line, the center of each of the third, fourth and the fifth storage elements is arranged on a second straight line, and the center of each of the second, the fifth, and the seventh storage elements is arranged on a third straight line, the storage elements arranged in a stacked arrangement whereby each of the storage elements is located above an associated one of the first signal lines and an associated one of the second signal lines, and
wherein the center of each of the storage elements is displaced from a point where the associated one of the first signal lines overlaps with the associated one of the second signal lines when viewed in plan view, only in a direction parallel to a longitudinal direction of the first signal lines.

10. The semiconductor device according to claim 9, further comprising:
a plurality of vertical MOS transistors, wherein each of the vertical MOS transistors has a lower diffusion layer in a semiconductor substrate, an upper diffusion layer on a top surface of the semiconductor substrate, and a gate electrode on a side surface of the semiconductor substrate,
wherein one of the storage elements is connected to the upper diffusion layer, and either one of the first signal lines or one of the second signal lines is connected to the lower diffusion layer, and
wherein the remaining one of the first signal lines or one of the second signal lines is connected to the gate electrode.

11. The semiconductor device according to claim 9, wherein the storage element is a capacitor.

12. The semiconductor device according to claim 9, wherein the storage element is a phase change material element or a resistive element, a resistance of the resistive element being changed by flowing a current.

13. The semiconductor device according to claim 9, wherein one of the first signal lines is a bit line and one of the second signal lines is a word line.

14. The semiconductor device according to claim 13,
wherein the word line comprises one of the first signal lines,
wherein one of the first signal lines comprises a first wiring layer and a second wiring layer, the first wiring layer being disposed facing to the second wiring layer with an intervention of a semiconductor pillar,
wherein the first wiring layer and the second wiring layer are configured to function as a single word line,
wherein the bit line comprises one of the second signal lines,
wherein one of the second signal lines comprises a third wiring layer and a fourth wiring layer, the third wiring layer being disposed facing to the fourth wiring layer with an intervention of the semiconductor pillar, and
wherein the third wiring layer and the fourth wiring layer are configured to function as a single bit line.

15. The semiconductor device according to claim 13,
wherein the bit line comprises one of the first signal lines,
wherein one of the first signal lines comprises a first wiring layer and a second wiring layer, the first wiring layer being disposed facing to the second wiring layer with an intervention of a semiconductor pillar,
wherein the first wiring layer and the second wiring layer are configured to function as a single bit line,
wherein the word line comprises one of the second signal lines,
wherein one of the second signal lines comprises a third wiring layer and a fourth wiring layer, the third wiring layer being disposed facing to the fourth wiring layer with an intervention of the semiconductor pillar, and
wherein the third wiring layer and the fourth wiring layer are configured to function as a single word line.

16. A semiconductor device having a stacked capacitor structure, comprising:
at least three first signal lines having first to third lines arranged sequentially and each extending in a first direction, the first and second lines being arranged at a first line pitch, and the second and third lines being arranged at the first line pitch;
a second signal line extending in a second direction perpendicular to the first direction to overlap with the first to third lines;
a single first capacitor formed over an overlapping point of the first line and the second signal line;
a single second capacitor formed over an overlapping point of the second line and the second signal line; and
a single third capacitor formed over an overlapping point of the third line and the second signal line,
wherein a center of the first capacitor and a center of the third capacitor are arranged on a first straight line,
wherein a center of the second capacitor is arranged on a second straight line different from the first straight line and parallel with the first straight line,
wherein each capacitor of the first, second and third capacitors is located above an associated one of the first signal lines and the second signal line, and
wherein the center of each capacitor of the first, second and third capacitors is displaced from a point where the associated one of the first signal lines overlaps with the second signal lines when viewed in plan view, only in a direction parallel to a longitudinal direction of the first signal lines.

17. The semiconductor device according to claim 16, further comprising:
a third signal line and a fourth signal line extending in the second direction perpendicular to the first direction to overlap with the first to third lines, the second and the third signal lines being arranged at a second line pitch, and the third and fourth signal lines being arranged at the second line pitch;
a fourth capacitor formed over an overlapping point of the first line and the third signal line;
a fifth capacitor formed over an overlapping point of the second line and the third signal line;
a sixth capacitor formed over an overlapping point of the third line and the third signal line; and
a seventh capacitor formed over an overlapping point of the second line and the fourth signal line,
wherein a center of the fourth capacitor and a center of the sixth capacitor are arranged on a third straight line,
wherein a center of the fifth capacitor is arranged on a fourth straight line different from the third straight line and parallel with the third straight line, and
wherein a center of the seventh capacitor is arranged on a fifth straight line different from the third straight line and parallel with the third straight line.

18. The semiconductor device according to claim 17, wherein the centers of the first, second, third, fourth, sixth and seventh capacitors form a regular hexagon.

19. The semiconductor device according to claim 16, wherein the first signal lines are bit lines and the second signal line is a word line.

20. The semiconductor device according to claim 16, further comprising:
a plurality of vertical MOS transistors,
wherein each of the vertical MOS transistors has a lower diffusion layer in a semiconductor substrate and an upper diffusion layer on a top surface of the semiconductor substrate,
wherein one of the capacitors is connected to the upper diffusion layer, and
wherein either one of the first signal lines or one of the second signal lines is connected to the lower diffusion layer.

* * * * *